United States Patent
Mamuye et al.

(10) Patent No.: US 10,927,294 B2
(45) Date of Patent: Feb. 23, 2021

(54) BRIGHT SILVER BASED QUATERNARY NANOSTRUCTURES

(71) Applicant: Nanosys, Inc., Milpitas, CA (US)

(72) Inventors: Ashenafi Damtew Mamuye, Milpitas, CA (US); Christopher Sunderland, San Jose, CA (US); Ilan Jen-La Plante, San Jose, CA (US); Chunming Wang, Milpitas, CA (US); John J. Curley, San Francisco, CA (US)

(73) Assignee: Nanosys, Inc., Milpitas, CA (US)

( * ) Notice: Subject to any disclaimer, the term of this patent is extended or adjusted under 35 U.S.C. 154(b) by 0 days.

(21) Appl. No.: 16/905,721

(22) Filed: Jun. 18, 2020

(65) Prior Publication Data
US 2020/0399535 A1    Dec. 24, 2020

Related U.S. Application Data

(60) Provisional application No. 62/864,059, filed on Jun. 20, 2019, provisional application No. 62/981,139, filed on Feb. 25, 2020.

(51) Int. Cl.
| | |
|---|---|
| *C09K 11/62* | (2006.01) |
| *C09K 11/02* | (2006.01) |
| *B32B 17/06* | (2006.01) |
| *B29K 509/02* | (2006.01) |

(Continued)

(52) U.S. Cl.
CPC .......... *C09K 11/621* (2013.01); *B32B 17/06* (2013.01); *C09K 11/02* (2013.01); *B29K 2509/02* (2013.01); *B32B 2255/10* (2013.01); *B32B 2255/205* (2013.01); *B32B 2264/105* (2013.01); *B32B 2307/202* (2013.01); *B32B 2307/42* (2013.01); *B32B 2457/202* (2013.01);
(Continued)

(58) Field of Classification Search
CPC .................... C09K 11/621; C09K 11/873
See application file for complete search history.

(56) References Cited

U.S. PATENT DOCUMENTS

| | | | |
|---|---|---|---|
| 8,759,053 B2 | 6/2014 | Phelps et al. | |
| 9,133,388 B2 | 9/2015 | Modi et al. | |
| 9,196,760 B2 | 11/2015 | Duty et al. | |

(Continued)

FOREIGN PATENT DOCUMENTS

| | | |
|---|---|---|
| CN | 101878535 B | 11/2010 |
| CN | 106191986 A | 12/2016 |

(Continued)

OTHER PUBLICATIONS

Cheng, K.-W. et al., "Influence of gallium on the growth and photoelectrochemical performances of $AgIn_5S_8$ photoelectrodes" *Thin Solid Films* 524:238-244, Elsevier, B.V., The Netherlands (2012).

(Continued)

*Primary Examiner* — Matthew E. Hoban
(74) *Attorney, Agent, or Firm* — Sterne, Kessler, Goldstein & Fox P.L.L.C.

(57) ABSTRACT

Disclosed are nanostructures comprising Ag, In, Ga, and S and a shell comprising Ag, Ga and S, wherein the nanostructures have a peak wavelength emission of 480-545 nm and wherein at least about 80% of the emission is band-edge emission. Also disclosed are methods of making the nanostructures.

30 Claims, 7 Drawing Sheets

(51) Int. Cl.
B82Y 20/00 (2011.01)
B82Y 40/00 (2011.01)

(52) U.S. Cl.
CPC ......... B32B 2457/206 (2013.01); B82Y 20/00 (2013.01); B82Y 40/00 (2013.01); C09K 2211/18 (2013.01)

(56) References Cited

U.S. PATENT DOCUMENTS

| | | | |
|---|---|---|---|
| 9,466,743 | B2 | 10/2016 | Harris et al. |
| 10,233,389 | B2 | 3/2019 | Torimoto et al. |
| 10,316,250 | B2 | 6/2019 | Guo et al. |
| 10,563,122 | B2 | 2/2020 | Kuwabata et al. |
| 2008/0277625 | A1* | 11/2008 | Nakamura ........... C09K 11/582 252/301.4 S |
| 2009/0159849 | A1* | 6/2009 | Uehara ................ C09K 11/621 252/301.65 |
| 2012/0168910 | A1 | 7/2012 | Jackrel et al. |
| 2013/0025680 | A1 | 1/2013 | Fujdala et al. |
| 2015/0162468 | A1 | 6/2015 | Newman |
| 2015/0287854 | A1 | 10/2015 | Cho et al. |
| 2016/0137916 | A1 | 5/2016 | Wachi |
| 2016/0380140 | A1* | 12/2016 | McDaniel ........... C09K 11/881 136/247 |
| 2017/0029697 | A1 | 2/2017 | Ghosh et al. |
| 2017/0243999 | A1 | 8/2017 | Wi et al. |
| 2017/0267924 | A1* | 9/2017 | Kuwabata ........... C09K 11/621 |
| 2018/0066183 | A1 | 3/2018 | Torimoto et al. |
| 2019/0006607 | A1 | 1/2019 | Yang et al. |
| 2020/0006601 | A1* | 1/2020 | Torimoto ............... B82Y 30/00 |
| 2020/0295227 | A1 | 9/2020 | Torimoto et al. |

FOREIGN PATENT DOCUMENTS

| | | |
|---|---|---|
| KR | 20150141914 A | 12/2015 |
| KR | 2016-0061267 A | 5/2016 |
| KR | 20160065230 A | 6/2016 |
| KR | 2016-0093429 A | 8/2016 |
| KR | 101665550 B1 | 10/2016 |
| KR | 20160141258 A | 12/2016 |
| KR | 101734464 B1 | 5/2017 |
| KR | 101734465 B1 | 5/2017 |
| KR | 20170100078 A | 9/2017 |
| KR | 20180016196 A | 2/2018 |
| KR | 101859173 B1 | 5/2018 |
| KR | 20180060923 A | 6/2018 |
| KR | 101897254 B1 | 9/2018 |
| KR | 20180108012 A | 10/2018 |
| KR | 20180123197 A | 11/2018 |
| KR | 20190000274 A | 1/2019 |
| KR | 20190010608 A | 1/2019 |
| KR | 20190059632 A | 5/2019 |
| KR | 20190101430 A | 8/2019 |
| KR | 20190118412 A | 10/2019 |
| KR | 20190119457 A | 10/2019 |
| WO | WO 2009/068878 A2 | 6/2009 |
| WO | WO 2012/164283 A1 | 12/2012 |
| WO | WO 2013/146872 A1 | 10/2013 |
| WO | WO 2018/159699 A1 | 9/2018 |

OTHER PUBLICATIONS

Cui, Y. et al., "Photoluminescence study of $AgGaSe_2$, $AgGa_{0.9}In_{0.1}Se_2$, and $AgGa_{0.8}In_{0.2}Se_2$ crystals grown by the horizontal Bridgman technique," *J. Appl. Phys.* 103:123514-1-123514-6, AIP Publishing, United States (2008).

Jang, J.S. et al., "Indium induced band gap tailoring in $AgGa_{1-x}IN_xS_2$ chalcopyrite structure for visible light photocatalysis," *J. Chem. Phys.* 128:154717-1-154717-6, AIP Publishing, United States (2008).

Kuwabata, S. et al., "Synthesis of New Fluorescent Semiconductor Nanoparticles and Their Optical Uses," *ECS Transactions* 45:131-137, Electrochemical Society, United States (2012).

Liang, N. et al., "$AgIn_xGa_{1-x}S_2$ solid solution nanocrystals: synthesis, band gap tuning and photocatalytic activity," *CrystEngComm* 16:10123-10130, RCS Publishing, United Kingdom (2014).

Maeda, S. et al., "Long Term Optical Properties of ZnS—-$AgInS_2$ and $AgInS_2$—$AgGaS_2$ Solid-Solution Semiconductor Nanoparticles Dispersed in Polymer Matrices," *Electrochemistry* 79:813-816, RCS Publishing, United Kingdom (2011).

Sun, J. et al., "Hierarchical microarchitectures of $AgGa_{1-x}In_xS_2$: Long chain alcohol assisted synthesis, band gap tailoring and photocatalytic activities of hydrogen generation," *Int. J. Hydrogen Energy* XXX:1-8, Elsevier Ltd., United Kingdom (2013).

Tseng, C.-J. et al., "Photoelectrochemical performance of gallium-doped $AgInS_2$ photoelectrodes prepared by electrodeposition process," *Solar Energy Materials & Solar Cells* 96:33-42, Elsevier B.V., The Netherlands (2012).

Kameyama et al., "Wavelength-Tunable Band-Edge Photoluminescence of Nonstoichiometric Ag—In—S Nanoparticles via $Ga^{3+}$ Doping", *ACS Appl. Mater. Interfaces* 10:42844-42855 (2018), American Chemical Society.

Uematsu et al., "Narrow band-edge photoluminescence from $AgInS_2$ semiconductor nanoparticles by the formation of amorphous III-VI semiconductor shells", *NPG Asia Materials* 10:713-726 (2018), Springer Nature.

Song, U-Seok and Yang, Hui-Seon, "A Study on the Production of White LED Based on High Quantum Efficiency Semiconductor Quantum Dots," *Ceramist*, vol. 16, Issue 2, pp. 28-41.

* cited by examiner

BRIGHT SILVER BASED QUATERNARY NANOSTRUCTURES

BACKGROUND OF THE INVENTION

Field of the Invention

The invention relates to the field of nanotechnology. More particularly, the invention provides nanostructures with a core comprising Ag, In, Ga, and S (AIGS) and a shell comprising Ag, Ga and S (AGS), wherein the nanostructures have a peak emission wavelength (PWL) between 480-545 nm, and wherein at least about 80% of the emission is band-edge emission. The disclosure also provides methods of making the AIGS/AGS core-shell nanostructures.

Background Art

Nanostructures comprising group semiconductors are promising candidates for non-toxic fluorescent materials. Uematsu et al., *NPG Asia Materials* 10:713-726 (2018) disclose $AgInS_2/GaS_x$ core/shell nanostructures where x ranged from 0.8 to 1.5. These core/shell nanostructures exhibited band-edge emission and broad, redshifted defect emission. Reduction in the defect emission was obtained by modifying the shelling procedure by the use of 1,3-dimethylthiourea (as sulfur source) and $Ga(acac)_3$ to generate GaS, and by the use of a temperature gradient reaction. However, the band-edge emission was redshifted and defect emission persisted.

Kameyama et al., *ACS Appl. Mater. Interfaces* 10:42844-42855 (2018) disclose Ag—In—Ga—S (AIGS) nanostructures with significant defect emission. The defect emission was reduced by application of a GaS shell. But defect emission remained at about 15% of the intensity of the band-edge emission and the photoluminescence quantum yield was low (<30%).

A need remains in the art for AIGS nanostructures with greatly high band edge emission (BE), narrow full width at half maximum (FWHM), high quantum yield (QY), and reduced redshifting.

BRIEF SUMMARY OF THE INVENTION

The present invention provides nanostructures comprising a core comprising Ag, In, Ga, and S (AIGS) and a shell comprising Ag, Ga and S (AGS), wherein the nanostructures have a peak emission wavelength (PWL) in the range of 480-545 nm and wherein at least about 80% of the emission is band-edge emission, and wherein the nanostructures exhibit a quantum yield (QY) of 80-99.9%.

In some embodiments, the nanostructures have an emission spectrum with a FWHM of less than 40 nm. In some embodiments, the nanostructures have an emission spectrum with a FWHM of 36-38 nm.

In some embodiments, the nanostructures have a QY of 82-96%. In some embodiments, the nanostructures have a QY in the inclusive range of 85-95%. In some embodiments, the nanostructures have a QY of 86-94%.

In some embodiments, the nanostructures have an $OD_{450}$/mass ($mL \cdot mg^{-1} \cdot cm^{-1}$) greater than or equal to 0.8. In some embodiments, the nanostructures have an $OD_{450}$/mass ($mL \cdot mg^{-1} \cdot cm^{-1}$) in the inclusive range 0.8-2.5. In some embodiments, the nanostructures have an $OD_{450}$/mass ($mL \cdot mg^{-1} \cdot cm^{-1}$) in the inclusive range 0.87-1.9.

In some embodiments, the average diameter of the nanostructures is less than 10 nm by TEM. In some embodiments, the average diameter is about 5 nm.

In some embodiments, at least about 80% of the emission is band-edge emission.

In some embodiments, at least about 90% of the emission is band-edge emission.

In some embodiments, the nanostructures are quantum dots.

The invention also provides a nanostructure composition comprising:
  (a) at least one population of the nanostructures described herein; and
  (b) at least one organic resin.

In some embodiments, the nanostructure composition comprises at least one second population of nanostructures that have a PWL greater than 545 nm.

Also provided is a method of preparing the nanostructure composition described herein, the method comprising:
  (a) providing at least one population of nanostructures described herein; and
  (b) admixing at least one organic resin with the at least one population of (a).

In some embodiments, at least about 80% of the emission is band-edge emission. In some embodiments, at least about 90% of the emission is band-edge emission.

Also provided is a device comprising the composition described herein.

Also provided is a film comprising the composition described herein, wherein the nanostructures are embedded in a matrix that comprises the film.

Also provided is a nanostructure molded article comprising:
  (a) a first conductive layer;
  (b) a second conductive layer; and
  (c) a nanostructure layer between the first conductive layer and the second conductive layer, wherein the nanostructure layer comprises the composition described herein.

Also provided method of making the core/shell nanostructures described herein, comprising:
  (a) preparing a mixture comprising Ag—In—Ga—S (AIGS) cores, a sulfur source, and a ligand;
  (b) adding the mixture obtained in (a) to a mixture of a gallium carboxylate and a ligand at a temperature of 180-300° C.;
  (c) holding the temperature in the range of 180-300° C. for 5-300 minutes; and
  (d) isolating the nanostructures.

In some embodiments, the ligand in (a) and (b) is an alkyl amine. In some embodiments, the alkyl amine is oleylamine.

In some embodiments, the sulfur source is derived from $S_8$.

In some embodiments, the temperature in (a) and (b) is about 270° C.

In some embodiments, the mixture in (b) further comprises a solvent. In some embodiments, the solvent is octadecene, dibenzyl ether or squalane.

In some embodiments, the ratio of gallium carboxylate to AIGS cores is 0.008-0.2 mmol of gallium carboxylate per mg AIGS.

In some embodiments, at least about 80% of the emission is band-edge emission. In some embodiments, at least about 90% of the emission is band-edge emission.

Also provided is a method of making the nanostructures described herein, comprising:
(a) preparing a mixture comprising Ag—In—Ga—S (AIGS) cores and a gallium halide in a solvent and holding the mixture for a time sufficient to give AIGS nanostructures with a PWL of 480-545 nm and wherein at least about 60% of the emission is band-edge emission, and
(b) isolating the nanostructures.

In some embodiments, the gallium halide is gallium iodide.

In some embodiments, the solvent comprises trioctylphosphine. In some embodiments, the solvent comprises toluene.

In some embodiments, the time sufficient in (a) is from 0.1-200 hours. In some embodiments, the time sufficient is about 20 hours.

In some embodiments, the mixture is held at 20 to 100° C. In some embodiments, the mixture is held at about room temperature.

In some embodiments, the molar ratio of gallium halide to AIGS cores is from about 0.1 to about 30.

Also provided method of making the core/shell nanostructures described herein, comprising:
(a) preparing a mixture comprising Ag—In—Ga—S (AIGS) cores, a sulfur source, a ligand and a gallium halide at 180-300° C.;
(b) holding the temperature in the range of 180-300° C. for 5-300 minutes; and
(c) isolating the nanostructures.

In some embodiments, the ligand in (a) is an alkyl amine. In some embodiments, the alkyl amine is oleylamine.

In some embodiments, the sulfur source is derived from $S_8$.

In some embodiments, the temperature in (a) and (b) is about 240° C.

In some embodiments, the mixture in (b) further comprises a solvent. In some embodiments, the solvent is octadecene, dibenzyl ether or squalane.

In some embodiments, the ratio of gallium halide to AIGS cores is 0.008-0.2 mmol of gallium carboxylate per mg AIGS.

In some embodiments, at least about 80% of the emission is band-edge emission. In some embodiments, at least about 90% of the emission is band-edge emission.

The invention also provides a method of making AIGS/AGS core-shell nanostructures that unexpectedly have very high band edge emission (>90%) and, at the same time, very high quantum yield (80-99%). The method comprises
(a) reacting Ga(acetylacetonate)$_3$, InCl$_3$, and a ligand optionally in a solvent at a temperature sufficient to give an In—Ga reagent, and
(b) reacting the In—Ga reagent with Ag$_2$S nanostructures at a temperature sufficient to make AIGS nanostructures,
(c) reacting the AIGS nanostructures with an oxygen-free Ga salt in a solvent containing a ligand at a temperature sufficient to form AIGS/AGS core-shell nanostructures.

In some embodiments, the ligand is an alkyl amine. In some embodiments, the alkylamine ligand is oleylamine. In some embodiments, the ligand acts as solvent and a second solvent is not required. In some embodiments, the solvent is present in the reaction mixture. In some embodiments, the solvent is a high boiling solvent such as octadecene, squalane, dibenzyl ether, or xylene. In some embodiments, the temperature sufficient in (a) is 100 to 280° C.; the temperature sufficient in (b) is 150 to 260° C.; and the temperature sufficient in (c) is 170 to 280° C. In some embodiments, the temperature sufficient in (a) is about 210° C., the temperature sufficient in (b) is about 210° C., and the temperature sufficient in (c) is about 240° C.

In some embodiments, a ligand is bound to the core-shell nanostructures. In some embodiments, the ligand is a silane. In some embodiments, the silane is an aminoalkyltrialkoxysilane or thioalkyltrialkoxysilane. In some embodiments, the aminoalkyltrialkoxysilane is 3-aminopropyl)triethoxysilane or 3-mercapopropyl)triethoxysilane.

Also provided are the core-shell nanostructures with a silane ligand adhered to a substrate. In some embodiments, the substrate is glass. In some embodiments, the glass is part of a quantum dot color conversion film. In some embodiments, the quantum dot color converter comprises
a back plane;
a display panel disposed on the back plane; and
a quantum dot layer comprising the nanostructures, the quantum dot layer diposed on the display panel.

In some embodiments, the quantum dot layer comprises a patterned quantum dot layer. In some embodiments, the back plane comprises an LED, an LCD, an OLED, or a microLED.

DETAILED DESCRIPTION OF THE INVENTION

Definitions

Figure 1A:
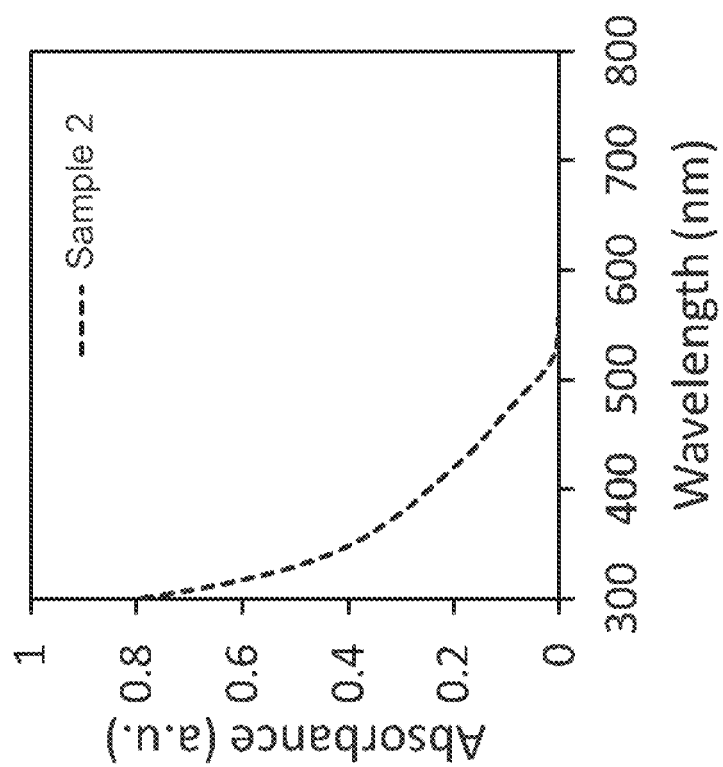
FIGS. 1A and 1B are graphs depicting the absorption spectrum (FIG. 1A) and photoluminescence spectrum (FIG. 1B) of Ag—In—Ga—S (AIGS) cores.

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in the practice for testing of the present invention, the preferred materials and methods are described herein. Accordingly, the terminology used herein is for the purpose of describing particular embodiments only, and is not intended to be limiting.

As used in this specification and the appended claims, the singular forms "a," "an" and "the" include plural referents unless the context clearly dictates otherwise. Thus, for example, reference to "a nanostructure" includes a plurality of such nanostructures, and the like.

The term "about" as used herein indicates the value of a given quantity varies by +/−10% of the value. For example, "about 100 nm" encompasses a range of sizes from 90 nm to 110 nm, inclusive.

A "nanostructure" is a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, quantum dots, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

A "nanocrystal" is a nanostructure that is substantially monocrystalline. A nanocrystal thus has at least one region or characteristic dimension with a dimension of less than about 500 nm. In some embodiments, the nanocrystal has a dimension of less than about 200 nm, less than about 100 nm, less than about 50 nm, less than about 20 nm, or less than about 10 nm. The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. In some embodiments, each of the three dimensions of the nanocrystal has a dimension of less than about 500 nm, less than about 200 nm, less than about 100 nm, less than about 50 nm, less than about 20 nm, or less than about 10 nm.

The term "quantum dot" (or "dot") refers to a nanocrystal that exhibits quantum confinement or exciton confinement. Quantum dots can be substantially homogeneous in material properties, or in certain embodiments, can be heterogeneous, e.g., including a core and at least one shell. The optical properties of quantum dots can be influenced by their particle size, chemical composition, and/or surface composition, and can be determined by suitable optical testing available in the art. The ability to tailor the nanocrystal size, e.g., in the range between about 1 nm and about 15 nm, enables photoemission coverage in the entire optical spectrum to offer great versatility in color rendering.

The term "oxygen-free ligand" refers to coordinating molecules that do not contain oxygen atoms that are able to coordinate to, or react with, metal ions used herein.

As used herein, the term "shell" refers to material deposited onto the core or onto previously deposited shells of the same or different composition and that result from a single act of deposition of the shell material. The exact shell thickness depends on the material as well as the precursor input and conversion and can be reported in nanometers or monolayers. As used herein, "target shell thickness" refers to the intended shell thickness used for calculation of the required precursor amount. As used herein, "actual shell thickness" refers to the actually deposited amount of shell material after the synthesis and can be measured by methods known in the art. By way of example, actual shell thickness can be measured by comparing particle diameters determined from transmission electron microscopy (TEM) images of nanocrystals before and after a shell synthesis.

As used herein, the term "layer" refers to material deposited onto the core or onto previously deposited layers and that result from a single act of deposition of the core or shell material. The exact thickness of a layer is dependent on the material.

A "ligand" is a molecule capable of interacting (whether weakly or strongly) with one or more faces of a nanostructure, e.g., through covalent, ionic, van der Waals, or other molecular interactions with the surface of the nanostructure.

"Photoluminescence quantum yield" (QY) is the ratio of photons emitted to photons absorbed, e.g., by a nanostructure or population of nanostructures. As known in the art, quantum yield is typically determined by the absolute change in photon counts upon illumination of the sample inside an integrating sphere, or a comparative method using well-characterized standard samples with known quantum yield values.

"Peak emission wavelength" (PWL) is the wavelength where the radiometric emission spectrum of the light source reaches its maximum.

As used herein, the term "full width at half-maximum" (FWHM) is a measure of the size distribution of quantum dots. The emission spectra of quantum dots generally have the shape of a Gaussian curve. The width of the Gaussian curve is defined as the FWHM and gives an idea of the size distribution of the particles. A smaller FWHM corresponds to a narrower quantum dot nanocrystal size distribution. FWHM is also dependent upon the emission wavelength maximum.

Band-edge emission is centered at higher energies (lower wavelengths) with a smaller offset from the absorption onset energy as compared to the corresponding defect emission. Additionally, the band-edge emission has a narrower distribution of wavelengths compared to the defect emission. Both band-edge and defect emission follow normal (approximately Gaussian) wavelength distributions.

Optical density (OD) is a commonly used method to quantify the concentration of solutes or nanoparticles. As per Beer-Lambert's law, the absorbance (also known as "extinction") of a particular sample is proportional to the concentration of solutes that absorb a particular wavelength of light.

Optical density is the optical attenuation per centimeter of material as measured using a standard spectrometer, typically specified with a 1 cm path length. Nanostructure solutions are often measured by their optical density in place of mass or molar concentration because it is directly proportional to concentration and it is a more convenient way to express the amount of optical absorption taking place in the nanostructure solution at the wavelength of interest. A nanostructure solution that has an OD of 100 is 100 times more concentrated (has 100 times more particles per mL) than a product that has an OD of 1.

Optical density can be measured at any wavelength of interest, such as at the wavelength chosen to excite a fluorescent nanostructure. Optical density is a measure of the intensity that is lost when light passes through a nanostructure solution at a particular wavelength and is calculated using the formula:

$$OD = \log_{10}*(I_{OUT}/I_{IN})$$

where:
$I_{OUT}$=the intensity of radiation passing into the cell; and
$I_{IN}$=the intensity of radiation transmitted through the cell.

The optical density of a nanostructure solution can be measured using a UV-VIS spectrometer. Thus, through the use of a UV-VIS spectrometer it is possible to calculate the optical density to determine the amount of quantum dots that are present in a sample.

Unless clearly indicated otherwise, ranges listed herein are inclusive.

A variety of additional terms are defined or otherwise characterized herein.

AIGS Nanostructures

Provided are nanostructures comprising Ag, In, Ga, and S, wherein the nanostructures have a peak emission wavelength (PWL) between 480-545 nm and wherein at least about 60% of the emission is band-edge emission.

The percentage of band-edge emission is calculated by fitting the Gaussian peaks (typically 2 or more) of the nanostructures emission spectrum and comparing the area of the peak that is closer in energy to the nanostructure bandgap (which represents the band-edge emission) to the sum of all peak areas (band-edge+defect emission).

In one embodiment, the nanostructures have a FWHM emission spectrum of less than 40 nm. In another embodiment, the nanostructures have a FWHM of 36-38 nm. In another embodiment, the nanostructures have a QY of at least 58%. In another embodiment, the nanostructures have a QY of 58-65%. In another embodiment, the nanostructures have a QY of about 65%. In some embodiments, at least 80% of the emission is band-edge emission. In other embodiments, at least 90% of the emission is band-edge emission. In other embodiments, at least 95% of the emission is band-edge emission. In some embodiments, 92-98% of the emission is band-edge emission. In some embodiments, 93-96% of the emission is band-edge emission. In another embodiment, the nanostructures are quantum dots.

The AIGS nanostructures provide high blue light absorption. As a predictive value for blue light absorption efficiency, the optical density at 450 nm on a per mass basis ($OD_{450}$/mass) is calculated by measuring the optical density of a nanostructure solution in a 1 cm path length cuvette and dividing by the dry mass per mL (mg/mL) of the same solution after removing all volatiles under vacuum (<200 mTorr). In one embodiment, the nanostructures provided herein have an $OD_{450}$/mass (mL·mg$^{-1}$·cm$^{-1}$) of at least 0.8.

In another embodiment, the nanostructures have $OD_{450}$/mass $(mL \cdot mg^{-1} \cdot cm^{-1})$ of 0.8-2.5. In another embodiment, the nanostructures have an $OD_{450}$/mass $(mL \cdot mg^{-1} \cdot cm^{-1})$ of 0.87-1.9.

In one embodiment, the nanostructures are core-shell nanostructures. In another embodiment, the nanostructures have Ag, In, Ga, and S in the core and Ga and S in the shell (AIGS/GS). In another embodiment, the nanostructures have Ag, In, Ga, and S in the core and Ag, Ga and S in the shell (AIGS/AGS)

In one embodiment, the average diameter of the nanostructures is less than 10 nm as measured by TEM. In another embodiment, the average diameter is about 5 nm.

AIGS Nanostructures Prepared Using a $GaX_3$ (X=F, Cl, or Br) Precursor and an Oxygen-Free Ligand Reports of AIGS preparation in the literature have not attempted to exclude oxygen-containing ligands. In the coating of AIGS with gallium containing shells, oxygen-containing ligands are often used to stabilize the Ga precursor. Commonly gallium(III) acetylacetonate is used as an easily air-handled precursor, whereas Ga(III) chloride requires careful handling due to moisture sensitivity. For example, in Kameyama et al., *ACS Appl. Mater. Interfaces* 10:42844-42855 (2018), gallium (III) acetylacetonate was used as the precursor for core and core/shell structures. Since gallium has a high affinity for oxygen, oxygen-containing ligands and using a gallium precursor that was not prepared under oxygen-free conditions may produce unwanted side reactions, such as gallium oxides, when Ga and S precursors are used to produce shells that contain a significant gallium content. These side reactions may lead to defects in the shells and result in lower quantum yields.

In some embodiments, AIGS nanostructures are prepared using oxygen-free $GaX_3$ (X=F, Cl, or Br) as a precursor in the preparation of the AIGS core. In some embodiments, AIGS nanostructures are prepared using $GaX_3$ (X=F, Cl, or Br) as a precursor and an oxygen-free ligand in the preparation of at least one shell on the AIGS nanostructure. In some embodiments, AIGS nanostructures are prepared using $GaX_3$ (X=F, Cl, or Br) as a precursor and an oxygen-free ligand in the preparation of the AIGS core and in the preparation of at least one shell on the AIGS core. In some embodiments, AIGS nanostructures are prepared using $GaX_3$ (X=F, Cl, or Br) as a precursor and an oxygen-free ligand in the preparation of the AIGS core and in the preparation of the shells on the AIGS core.

Provided are nanostructures comprising Ag, In, Ga, and S, wherein the nanostructures have a peak emission wavelength (PWL) between 480-545 nm, and wherein the nanostructures were prepared using a $GaX_3$ (X=F, Cl, or Br) precursor and an oxygen-free ligand.

In some embodiments, the nanostructures prepared using a $GaX_3$ (X=F, Cl, or Br) precursor and an oxygen-free ligand display a FWHM emission spectrum of 35 nm or less. In some embodiments, the nanostructures prepared using a $GaX_3$ (X=F, Cl, or Br) precursor and an oxygen-free ligand display a FWHM of 30-38 nm. In some embodiments, the nanostructures prepared using a $GaX_3$ (X=F, Cl, or Br) precursor and an oxygen-free ligand have a QY of at least 75%. In some embodiments, the nanostructures prepared using a $GaX_3$ (X=F, Cl, or Br) precursor and an oxygen-free ligand have a QY of 75-90%. In some embodiments, the nanostructures prepared using $GaX_3$ (X=F, Cl, or Br) precursor and an oxygen-free ligand have a QY of about 80%. In some embodiments, the nanostructures are quantum dots.

The AIGS nanostructures prepared herein provide high blue light absorption. In some embodiments, the nanostructures have an $OD_{450}$/mass $(mL \cdot mg^{-1} \cdot cm^{-1})$ of at least 0.8. In some embodiments, the nanostructures have an $OD_{450}$/mass $(mL \cdot mg^{-1} \cdot cm^{-1})$ of 0.8-2.5. In another embodiment, the nanostructures have an $OD_{450}$/mass $(mL \cdot mg^{-1} \cdot cm^{-1})$ of 0.87-1.9.

In some embodiments, the nanostructures are core/shell nanostructures. In some embodiments, the nanostructures comprise Ag, In, Ga, and S in the core and Ga and S in the shell. In some embodiments, the nanostructures are AIGS/AGS core/shell nanostructures are prepared using a $GaX_3$ (X=F, Cl, or Br) precursor and an oxygen-free ligand in the core. In some embodiments, the nanostructures are AIGS/AGS core/shell nanostructures are prepared using a $GaX_3$ (X=F, Cl, or Br) precursor and an oxygen-free ligand in the shell. In some embodiments, the nanostructures are AIGS/AGS core/shell nanostructures are prepared using a $GaX_3$ (X=F, Cl, or Br) precursor and an oxygen-free ligand in the core and in the shell. In some embodiments, the AIGS/AGS core/shell nanostructures are prepared by reacting a preformed In—Ga reagent with $Ag_2S$ nanostructures to give AIGS nanostructures, followed by reacting with an oxygen-free Ga salt to form the AIGS/AGS core-shell nanostructures.

Methods of Making AIGS Nanostructures

Provided are methods of making the core/shell nanostructures having a PWL of 480-545 nm, wherein at least about 60% of the emission is band-edge emission, comprising:

(a) preparing a mixture comprising Ag—In—Ga—S (AIGS) cores, a sulfur source, and a ligand;

(b) adding the mixture obtained in (a) to a mixture of a gallium carboxylate and a ligand at a temperature of 180-300° C. to give nanostructures having a PWL of 480-545 nm, wherein at least about 60% of the emission is band-edge emission; and (c) isolating the nanostructures.

Also provided is method of making the AIGS/AGS core-shell nanostructures, comprising reacting $Ga(acetylacetonate)_3$, $InCl_3$, and a ligand optionally in a solvent at a temperature sufficient to give an In—Ga reagent, and reacting the In—Ga reagent with $Ag_2S$ nanostructures at a temperature sufficient to make AIGS nanostructures, reacting the AIGS nanostructures with an oxygen-free Ga salt in a solvent containing a ligand at a temperature sufficient to form AIGS/AGS core-shell nanocrystals.

In some embodiments, the ligand is an alkyl amine. In some embodiments, the alkylamine ligand is oleylamine. In some embodiment, the ligand is used in excess and acts as a solvent and the recited solvent is absent in the reaction. In some embodiments, the solvent is present in the reaction. In some embodiment, the solvent is a high boiling solvent. In some embodiments, the solvent is octadecene, squalane, dibenzyl ether or xylene. In some embodiments, the temperature sufficient in (a) is 100 to 280° C.; the temperature sufficient in (b) is 150 to 260° C.; and the temperature sufficient in (c) is 170 to 280° C. In some embodiments, the temperature sufficient in (a) is about 210° C., the temperature sufficient in (b) is about 210° C., and the temperature sufficient in (c) is about 240° C.

In some embodiments, at least 80% of the emission is band-edge emission. In other embodiments, at least 90% of the emission is band-edge emission. In other embodiments, at least 95% of the emission is band-edge emission. In some embodiments, 92-98% of the emission is band-edge emission. In some embodiments, 93-96% of the emission is band-edge emission. In another embodiment, the nanostructures are quantum dots.

Examples of ligands are disclosed in U.S. Pat. Nos. 7,572,395, 8,143,703, 8,425,803, 8,563,133, 8,916,064, 9,005,480, 9,139,770, and 9,169,435, and in U.S. Patent Application Publication No. 2008/0118755. In one embodiment, the ligand is an alkyl amine. In some embodiments, the ligand is an alkyl amine selected from the group consisting of dodecylamine, oleylamine, hexadecylamine, dioctylamine, and octadecylamine.

In some embodiments, the sulfur source in (a) comprises trioctylphosphine sulfide, elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, or combinations thereof. In some embodiments, the sulfur source in (a) is derived from $S_8$.

In one embodiment, the sulfur source is derived from $S_8$.

In one embodiment, the temperature in (a) and (b) is about 270° C.

In some embodiments, the mixture in (b) further comprises a solvent. In some embodiments, the solvent is trioctylphosphine, dibenzyl ether, or squalane.

In some embodiments, the gallium carboxylate is a gallium $C_{2-24}$ carboxylate. Examples of $C_{2-24}$ carboxylates include acetate, propionate, butanoate, pentanoate, hexanoate, heptanoate, octanoate, nonanoate, decanoate, undecanoate, tridecanoate, tetradecanoate, pentadecanoate, hexadecanoate, octadecanoate (oleate), nonadecanoate, and icosanoate. In one embodiment, the gallium carboxylate is gallium oleate.

In some embodiments, the ratio of gallium carboxylate to AIGS cores is 0.008-0.2 mmol gallium carboxylate per mg AIGS. In one embodiment, the ratio of gallium carboxylate to AIGS cores is about 0.04 mmol gallium carboxylate per mg AIGS.

In a further embodiment, the AIGS/AGS core/shell nanostructures are isolated, e.g., by precipitation. In some embodiments, the AIGS/AGS core/shell nanostructures are precipitated by addition of a non-solvent for the AIGS/AGS core/shell nanostructures. In some embodiments, the non-solvent is a toluene/ethanol mixture. The precipitated nanostructures may be further isolated by centrifugation and washing with a non-solvent for the nanostructures.

Also provided is a method of making the nanostructures having a PWL of 480-545 nm, and wherein at least about 60% of the emission is band-edge emission; comprising:
 (a) preparing a mixture comprising AIGS cores and a gallium halide in a solvent and holding the mixture for a time sufficient to give AIGS nanostructures with a PWL of 480-545 nm, wherein at least about 60% of the emission is band-edge emission; and
 (b) isolating the nanostructures.

In some embodiments, at least 80% of the emission is band-edge emission. In other embodiments, at least 90% of the emission is band-edge emission. In other embodiments, at least 95% of the emission is band-edge emission. In another embodiment, the nanostructures are quantum dots.

In some embodiments, the gallium halide is gallium chloride, bromide or iodide. In one embodiment, the gallium halide is gallium iodide.

In some embodiments, the solvent comprises trioctylphosphine. In some embodiments, the solvent comprises toluene.

In some embodiments, the time sufficient in (a) is from 0.1-200 hours. In some embodiments, the time sufficient in (a) is about 20 hours.

In some embodiments, the mixture is held at 20 to 100° C. In one embodiment, the mixture is held at about room temperature (20° C. to 25° C.).

In some embodiments, the molar ratio of gallium halide to AIGS cores is from about 0.1 to about 30.

In a further embodiment, the AIGS nanostructures are isolated, e.g., by precipitation. In some embodiments, the AIGS nanostructures are precipitated by addition of a non-solvent for the AIGS nanostructures. In some embodiments, the non-solvent is a toluene/ethanol mixture. The precipitated nanostructures may be further isolated by centrifugation and/or washing with a non-solvent for the nanostructures.

Methods of Making AIGS Nanostructures Prepared Using a $GaX_3$ (X=F, Cl, or Br) Precursor and an Oxygen-Free Ligand Provided are methods of making the core/shell nanostructures having a PWL of 480-545 nm, wherein at least about 60% of the emission is band-edge emission, comprising:
 (a) preparing a mixture comprising Ag—In—Ga—S (AIGS) cores, a sulfur source, and a ligand;
 (b) adding the mixture obtained in (a) to a mixture of a $GaX_3$ (X=F, Cl, or Br) and an oxygen-free ligand at a temperature of 180-300° C. to give nanostructures having a PWL of 480-545 nm, wherein at least about 60% of the emission is band-edge emission; and
 (d) isolating the nanostructures.

In some embodiments, the preparing in (a) is under oxygen-free conditions. In some embodiments, the preparing in (a) is in a glovebox.

In some embodiments, the adding in (b) is under oxygen-free conditions. In some embodiments, the adding in (b) is in a glovebox.

In some embodiments, at least 80% of the emission is band-edge emission. In other embodiments, at least 90% of the emission is band-edge emission. In other embodiments, at least 95% of the emission is band-edge emission. In another embodiment, the nanostructures are quantum dots.

Examples of ligands are disclosed in U.S. Pat. Nos. 7,572,395, 8,143,703, 8,425,803, 8,563,133, 8,916,064, 9,005,480, 9,139,770, and 9,169,435, and in U.S. Patent Application Publication No. 2008/0118755. In some embodiments, the ligand in (a) is an oxygen-free ligand. In some embodiments, the ligand in (b) is an oxygen-free ligand. In some embodiments, the ligand in (a) and (b) is an alkyl amine. In some embodiments, the ligand is an alkyl amine selected from the group consisting of dodecylamine, oleylamine, hexadecylamine, dioctylamine, and octadecylamine. In some embodiments, the ligand in (a) is oleylamine. In some embodiments, the ligand in (b) is oleylamine. In some embodiments, the ligand in (a) and (b) is oleylamine.

In one embodiment, the sulfur source is derived from $S_8$.

In one embodiment, the temperature in (a) and (b) is about 270° C.

In some embodiments, the mixture in (b) further comprises a solvent. In some embodiments, the solvent is trioctylphosphine, dibenzyl ether, or squalane.

In some embodiments, the $GaX_3$ is gallium chloride, gallium fluoride, or gallium iodide. In some embodiments, the $GaX_3$ is gallium chloride. In some embodiments, the $GaX_3$ is Ga(III) chloride.

In some embodiments, the ratio of $GaX_3$ to AIGS cores is 0.008-0.2 mmol $GaX_3$ per mg AIGS. In some embodiments, the molar ratio of $GaX_3$ to AIGS cores is from about 0.1 to about 30. In some embodiments, the ratio of $GaX_3$ to AIGS cores is about 0.04 mmol $GaX_3$ per mg AIGS.

In some embodiments, the AIGS/AGS core/shell nanostructures are isolated, e.g., by precipitation. In some embodiments, the AIGS/AGS core/shell nanostructures are precipitated by addition of a non-solvent for the AIGS/AGS core/shell nanostructures. In some embodiments, the non-solvent is a toluene/ethanol mixture. The precipitated nanostructures may be further isolated by centrifugation and/or washing with a non-solvent for the nanostructures.

In some embodiments, the mixture in (a) is held at 20° C. to 100° C. In some embodiments, the mixture in (a) is held at about room temperature (20° C. to 25° C.).

In some embodiments, the mixture in (b) is held at 200° C. to 300° C. for 0.1 hour to 200 hours. In some embodiments, the mixture in (b) is held at 200° C. to 300° C. for about 20 hours.

AIGS Cores

The synthesis of Group III-V nanostructures has been described in U.S. Pat. Nos. 5,505,928, 6,306,736, 6,576,291, 6,788,453, 6,821,337, 7,138,098, 7,557,028, 8,062,967, 7,645,397, and 8,282,412 and in U.S. Patent Appl. Publication No. 2015/236195. Synthesis of Group III-V nanostructures has also been described in Wells, R. L., et al., "The use of tris(trimethylsilyl)arsine to prepare gallium arsenide and indium arsenide," *Chem. Mater.* 1:4-6 (1989) and in Guzelian, A. A., et al., "Colloidal chemical synthesis and characterization of InAs nanocrystal quantum dots," *Appl. Phys. Lett.* 69: 1432-1434 (1996).

In some embodiments, the core is doped. In some embodiments, the dopant of the nanocrystal core comprises a metal, including one or more transition metals. In some embodiments, the dopant is a transition metal selected from the group consisting of Ti, Zr, Hf, V, Nb, Ta, Cr, Mo, W, Mn, Tc, Re, Fe, Ru, Os, Co, Rh, Ir, Ni, Pd, Pt, Cu, Ag, Au, and combinations thereof. In some embodiments, the dopant comprises a non-metal. In some embodiments, the dopant is ZnS, ZnSe, ZnTe, CdSe, CdS, CdTe, HgS, HgSe, HgTe, $CuInS_2$, $CuInSe_2$, AlN, AlP, AlAs, GaN, GaP, or GaAs.

In some embodiments, the core is purified before deposition of a shell. In some embodiments, the core is filtered to remove precipitate from the core solution.

Nanostructure Shells

In some embodiments, the shell comprises a mixture of silver, gallium and sulfur elements that are deposited onto the core or a core/shell(s) structure.

In some embodiments, the shell is doped. In some embodiments, the dopant of the nanocrystal shell comprises a metal, including one or more transition metals. In some embodiments, the dopant is a transition metal selected from the group consisting of Ti, Zr, Hf, V, Nb, Ta, Cr, Mo, W, Mn, Tc, Re, Fe, Ru, Os, Co, Rh, Ir, Ni, Pd, Pt, Cu, Ag, Au, and combinations thereof. In some embodiments, the dopant comprises a non-metal. In some embodiments, the dopant is ZnS, ZnSe, ZnTe, CdSe, CdS, CdTe, HgS, HgSe, HgTe, $CuInS_2$, $CuInSe_2$, AlN, AlP, AlAs, GaN, GaP, or GaAs.

In some embodiments, the core/shell nanostructure is purified before deposition of an additional shell. In some embodiments, the core/shell nanostructure is filtered to remove precipitate from the core/shell nanostructure solution.

Nanostructure Compositions

In some embodiments, the present disclosure provides a nanostructure composition comprising:
(a) at least one population of nanostructures, wherein the nanostructures have a core that comprises Ag, In, Ga, and S (AIGS), a shell that comprises Ag, Ga and S (AGS) have a PWL between 480-545 nm, and wherein at least about 80% of the emission is band-edge emission; and
(b) at least one organic resin.

In some embodiments, at least 80% of the emission is band-edge emission. In other embodiments, at least 90% of the emission is band-edge emission. In other embodiments, at least 95% of the emission is band-edge emission. In some embodiments, 92-98% of the emission is band-edge emission. In some embodiments, 93-96% of the emission is band-edge emission. In another embodiment, the nanostructures are quantum dots.

In some embodiments, the nanostructure composition further comprises at least one second population of nanostructures. The nanostructures having a PWL between 480-545 nm emit green light. Additional populations of nanostructures may be added that emit in the green, yellow, orange, and/or red regions of the spectrum. These nanostructures have a PWL greater than 545 nm. In some embodiments, the nanostructures have a PWL between 550-750 nm. The size of the nanostructures determines the emission wavelength. The at least one second population of nanostructures may comprise a Group III-V nanocrystal selected from the group consisting of BN, BP, BAs, BSb, AlN, AlP, AlAs, AlSb, GaN, GaP, GaAs, GaSb, InN, InP, InAs, and InSb. In some embodiments, the core of the second population of nanostructures is an InP nanocrystal.

Organic Resin

In some embodiments, the organic resin is a thermosetting resin or an ultraviolet (UV) curable resin. In some embodiments, the organic resin is cured by a method that facilitates roll-to-roll processing.

Thermosetting resins require curing in which they undergo an irreversible molecular cross-linking process which renders the resin infusible. In some embodiments, the thermosetting resin is an epoxy resin, a phenolic resin, a vinyl resin, a melamine resin, a urea resin, an unsaturated polyester resin, a polyurethane resin, an allyl resin, an acrylic resin, a polyamide resin, a polyamide-imide resin, a phenolamine condensation polymerization resin, a urea melamine condensation polymerization resin, or combinations thereof.

In some embodiments, the thermosetting resin is an epoxy resin. Epoxy resins are easily cured without evolution of volatiles or by-products by a wide range of chemicals. Epoxy resins are also compatible with most substrates and tend to wet surfaces easily. See Boyle, M. A., et al., "Epoxy Resins," Composites, Vol. 21, ASM Handbook, pages 78-89 (2001).

In some embodiments, the organic resin is a silicone thermosetting resin. In some embodiments, the silicone thermosetting resin is OE6630A or OE6630B (Dow Corning Corporation, Auburn, Mich.).

In some embodiments, a thermal initiator is used. In some embodiments, the thermal initiator is AIBN [2,2'-Azobis(2-methylpropionitrile)] or benzoyl peroxide.

UV curable resins are polymers that cure and quickly harden when exposed to a specific light wavelength. In some embodiments, the UV curable resin is a resin having as a functional group a radical-polymerization group such as a (meth)acrylyloxy group, a vinyloxy group, a styryl group, or a vinyl group; a cation-polymerizable group such as an epoxy group, a thioepoxy group, a vinyloxy group, or an oxetanyl group. In some embodiments, the UV curable resin is a polyester resin, a polyether resin, a (meth)acrylic resin, an epoxy resin, a urethane resin, an alkyd resin, a spiroacetal resin, a polybutadiene resin, or a polythiolpolyene resin.

In some embodiments, the UV curable resin is selected from the group consisting of urethane acrylate, allyloxylated cyclohexyl diacrylate, bis(acryloxy ethyl)hydroxyl isocyanurate, bis(acryloxy neopentylglycol)adipate, bisphenol A diacrylate, bisphenol A dimethacrylate, 1,4-butanediol diacrylate, 1,4-butanediol dimethacrylate, 1,3-butyleneglycol diacrylate, 1,3-butyleneglycol dimethacrylate, dicyclopentanyl diacrylate, diethyleneglycol diacrylate, diethyleneglycol dimethacrylate, dipentaerythritol hexaacrylate, dipentaerythritol monohydroxy pentaacrylate, di(trimethylolpropane) tetraacrylate, ethyleneglycol dimethacrylate, glycerol methacrylate, 1,6-hexanediol diacrylate, neopentylglycol dimethacrylate, neopentylglycol hydroxypivalate diacrylate, pentaerythritol triacrylate, pentaerythritol tetraacrylate, phosphoric acid dimethacrylate, polyethyleneglycol diacrylate, polypropyleneglycol diacrylate, tetraethyleneglycol diacrylate, tetrabromobisphenol A diacrylate, triethyleneglycol divinylether, triglycerol diacrylate, trimethylolpropane triacrylate, tripropyleneglycol diacrylate, tris(acryloxyethyl) isocyanurate, phosphoric acid triacrylate, phosphoric acid diacrylate, acrylic acid propargyl ester, vinyl terminated polydimethylsiloxane, vinyl terminated diphenyl siloxane-dimethylsiloxane copolymer, vinyl terminated polyphenyl-methylsiloxane, vinyl terminated trifluoromethylsiloxane-dimethylsiloxane copolymer, vinyl terminated diethylsiloxane-dimethylsiloxane copolymer, vinylmethylsiloxane, monomethacryloyloxypropyl terminated polydimethyl siloxane, monovinyl terminated polydimethyl siloxane, monoallyl-mono trimethylsiloxy terminated polyethylene oxide, and combinations thereof.

In some embodiments, the UV curable resin is a mercapto-functional compound that can be cross-linked with an isocyanate, an epoxy, or an unsaturated compound under UV curing conditions. In some embodiments, the polythiol is pentaerythritol tetra(3-mercapto-propionate) (PETMP); trimethylol-propane tri(3-mercapto-propionate) (TMPMP); glycol di(3-mercapto-propionate) (GDMP); tris[25-(3-mercapto-propionyloxy)ethyl]isocyanurate (TEMPIC); di-pentaerythritol hexa(3-mercapto-propionate) (Di-PETMP); ethoxylated trimethylolpropane tri(3-mercapto-propionate) (ETTMP 1300 and ETTMP 700); polycaprolactone tetra(3-mercapto-propionate) (PCL4MP 1350); pentaerythritol tetramercaptoacetate (PETMA); trimethylol-propane trimercaptoacetate (TMPMA); or glycol dimercaptoacetate (GDMA). These compounds are sold under the trade name THIOCURE® by Bruno Bock, Marschacht, Germany.

In some embodiments, the UV curable resin is a polythiol. In some embodiments, the UV curable resin is a polythiol selected from the group consisting of ethylene glycol bis (thioglycolate), ethylene glycol bis(3-mercaptopropionate), trimethylol propane tris (thioglycolate), trimethylol propane tris (3-mercaptopropionate), pentaerythritol tetrakis (thioglycolate), pentaerythritol tetrakis(3-mercaptopropionate) (PETMP), and combinations thereof. In some embodiments, the UV curable resin is PETMP.

In some embodiments, the UV curable resin is a thiol-ene formulation comprising a polythiol and 1,3,5-Triallyl-1,3,5-triazine-2,4,6 (1H,3H,5H)-trione (TTT). In some embodiments, the UV curable resin is a thiol-ene formulation comprising PETMP and TTT.

In some embodiments, the UV curable resin further comprises a photoinitiator. A photoinitiator initiates the crosslinking and/or curing reaction of the photosensitive material during exposure to light. In some embodiments, the photoinitiator is acetophenone-based, benzoin-based, or thioxathenone-based.

In some embodiments, the photoinitiator is a vinyl acrylate-based resin. In some embodiments, the photoinitiator is MINS-311RM (Minuta Technology Co., Ltd, Korea).

In some embodiments, the photoinitiator is IRGACURE® 127, IRGACURE® 184, IRGACURE® 184D, IRGACURE® 2022, IRGACURE® 2100, IRGACURE® 250, IRGACURE® 270, IRGACURE® 2959, IRGACURE® 369, IRGACURE® 369 EG, IRGACURE® 379, IRGACURE® 500, IRGACURE® 651, IRGACURE® 754, IRGACURE® 784, IRGACURE® 819, IRGACURE® 819Dw, IRGACURE® 907, IRGACURE® 907 FF, IRGACURE® Oxe01, IRGACURE® TPO-L, IRGACURE® 1173, IRGACURE® 1173D, IRGACURE® 4265, IRGACURE® BP, or IRGACURE® MBF (BASF Corporation, Wyandotte, Mich.). In some embodiments, the photoinitiator is TPO (2,4,6-trimethylbenzoyl-diphenyl-phosphine oxide) or MBF (methyl benzoylformate).

In some embodiments, the weight percentage of the at least one organic resin in the nanostructure composition is between about 5% and about 99%, about 5% and about 95%, about 5% and about 90%, about 5% and about 80%, about 5% and about 70%, about 5% and about 60%, about 5% and about 50%, about 5% and about 40%, about 5% and about 30%, about 5% and about 20%, about 5% and about 10%, about 10% and about 99%, about 10% and about 95%, about 10% and about 90%, about 10% and about 80%, about 10% and about 70%, about 10% and about 60%, about 10% and about 50%, about 10% and about 40%, about 10% and about 30%, about 10% and about 20%, about 20% and about 99%, about 20% and about 95%, about 20% and about 90%, about 20% and about 80%, about 20% and about 70%, about 20% and about 60%, about 20% and about 50%, about 20% and about 40%, about 20% and about 30%, about 30% and about 99%, about 30% and about 95%, about 30% and about 90%, about 30% and about 80%, about 30% and about 70%, about 30% and about 60%, about 30% and about 50%, about 30% and about 40%, about 40% and about 99%, about 40% and about 95%, about 40% and about 90%, about 40% and about 80%, about 40% and about 70%, about 40% and about 60%, about 40% and about 50%, about 50% and about 99%, about 50% and about 95%, about 50% and about 90%, about 50% and about 80%, about 50% and about 70%, about 50% and about 60%, about 60% and about 99%, about 60% and about 95%, about 60% and about 90%, about 60% and about 80%, about 60% and about 70%, about 70% and about 99%, about 70% and about 95%, about 70% and about 90%, about 70% and about 80%, about 80% and about 99%, about 80% and about 95%, about 80% and about 90%, about 90% and about 99%, about 90% and about 95%, or about 95% and about 99%.

Method of Preparing AIGS Nanostructure Composition

The present disclosure provides a method of preparing a nanostructure composition, the method comprising:
(a) providing at least one population of AIGS/AGS core-shell nanostructures, the nanostructures comprising Ag, In, Ga, and S, wherein the nanostructures have a PWL of between 480-545 nm, and wherein at least about 80% of the emission is band-edge emission; and
(b) admixing at least one organic resin with the composition of (a).

In some embodiments, at least 80% of the emission is band-edge emission. In other embodiments, at least 90% of the emission is band-edge emission. In other embodiments, at least 95% of the emission is band-edge emission. In some embodiments, 92-98% of the emission is band-edge emission. In some embodiments, 93-96% of the emission is band-edge emission. In another embodiment, the nanostructures are quantum dots.

The present disclosure also provides a method of preparing a nanostructure composition, the method comprising:
(a) providing at least one population of nanostructures, the nanostructures comprising Ag, In, Ga, and S, wherein the nanostructures have a PWL of between 480-545 nm, wherein at least about 60% of the emission is band-edge emission, and wherein the nanostructures were prepared using a $GaX_3$ (X=F, Cl, or Br) precursor and an oxygen-free ligand; and
(b) admixing at least one organic resin with the composition of (a).

The present disclosure also provides a method of preparing a nanostructure composition, the method comprising:
(a) providing at least one population of AIGS/AGS core-shell nanostructures, wherein the nanostructures have a PWL of between 480-545 nm, wherein at least about 80% of the emission is band-edge emission, and wherein the nanostructures exhibit a QY of 80-99%; and
(b) admixing at least one organic resin with the composition of (a).

In some embodiments, the at least one population of nanostructures is admixed with at least one organic resin at an agitation rate of between about 100 rpm and about 10,000 rpm, about 100 rpm and about 5,000 rpm, about 100 rpm and about 3,000 rpm, about 100 rpm and about 1,000 rpm, about 100 rpm and about 500 rpm, about 500 rpm and about 10,000 rpm, about 500 rpm and about 5,000 rpm, about 500 rpm and about 3,000 rpm, about 500 rpm and about 1,000 rpm, about 1,000 rpm and about 10,000 rpm, about 1,000 rpm and about 5,000 rpm, about 1,000 rpm and about 3,000 rpm, about 3,000 rpm and about 10,000 rpm, about 3,000 rpm and about 10,000 rpm, about 3,000 rpm and about 10,000 rpm, or about 5,000 rpm and about 10,000 rpm.

In some embodiments, the at least one population of nanostructures is admixed with at least one organic resin for a time of between about 10 minutes and about 24 hours, about 10 minutes and about 20 hours, about 10 minutes and about 15 hours, about 10 minutes and about 10 hours, about 10 minutes and about 5 hours, about 10 minutes and about 1 hour, about 10 minutes and about 30 minutes, about 30 minutes and about 24 hours, about 30 minutes and about 20 hours, about 30 minutes and about 15 hours, about 30 minutes and about 10 hours, about 30 minutes and about 5 hours, about 30 minutes and about 1 hour, about 1 hour and about 24 hours, about 1 hour and about 20 hours, about 1 hour and about 15 hours, about 1 hour and about 10 hours, about 1 hour and about 5 hours, about 5 hours and about 24 hours, about 5 hours and about 20 hours, about 5 hours and about 15 hours, about 5 hours and about 10 hours, about 10 hours and about 24 hours, about 10 hours and about 20 hours, about 10 hours and about 15 hours, about 15 hours and about 24 hours, about 15 hours and about 20 hours, or about 20 hours and about 24 hours.

In some embodiments, the at least one population of nanostructures is admixed with at least one organic resin at a temperature between about −5° C. and about 100° C., about −5° C. and about 75° C., about −5° C. and about 50° C., about −5° C. and about 23° C., about 23° C. and about 100° C., about 23° C. and about 75° C., about 23° C. and about 50° C., about 50° C. and about 100° C., about 50° C. and about 75° C., or about 75° C. and about 100° C. In some embodiments, the at least one organic resin is admixed with the at least one population of nanostructures at a temperature between about 23° C. and about 50° C.

In some embodiments, if more than one organic resin is used, the organic resins are added together and mixed. In some embodiments, a first organic resin is mixed with a second organic resin at an agitation rate of between about 100 rpm and about 10,000 rpm, about 100 rpm and about 5,000 rpm, about 100 rpm and about 3,000 rpm, about 100 rpm and about 1,000 rpm, about 100 rpm and about 500 rpm, about 500 rpm and about 10,000 rpm, about 500 rpm and about 5,000 rpm, about 500 rpm and about 3,000 rpm, about 500 rpm and about 1,000 rpm, about 1,000 rpm and about 10,000 rpm, about 1,000 rpm and about 5,000 rpm, about 1,000 rpm and about 3,000 rpm, about 3,000 rpm and about 10,000 rpm, about 3,000 rpm and about 10,000 rpm, or about 5,000 rpm and about 10,000 rpm.

In some embodiments, a first organic resin is mixed with a second organic resin for a time of between about 10 minutes and about 24 hours, about 10 minutes and about 20 hours, about 10 minutes and about 15 hours, about 10 minutes and about 10 hours, about 10 minutes and about 5 hours, about 10 minutes and about 1 hour, about 10 minutes and about 30 minutes, about 30 minutes and about 24 hours, about 30 minutes and about 20 hours, about 30 minutes and about 15 hours, about 30 minutes and about 10 hours, about 30 minutes and about 5 hours, about 30 minutes and about 1 hour, about 1 hour and about 24 hours, about 1 hour and about 20 hours, about 1 hour and about 15 hours, about 1 hour and about 10 hours, about 1 hour and about 5 hours, about 5 hours and about 24 hours, about 5 hours and about 20 hours, about 5 hours and about 15 hours, about 5 hours and about 10 hours, about 10 hours and about 24 hours, about 10 hours and about 20 hours, about 10 hours and about 15 hours, about 15 hours and about 24 hours, about 15 hours and about 20 hours, or about 20 hours and about 24 hours.

Properties of AIGS Nanostructures

In some embodiments, the nanostructure is a core/shell nanostructure. In some embodiments, the nanostructure is an AIGS/AGS core-shell nanostructure In some embodiments, the nanostructures display a high photoluminescence quantum yield. In some embodiments, the nanostructures display a photoluminescence quantum yield of between about 50% and about 99%, about 50% and about 95%, about 50% and about 90%, about 50% and about 85%, about 50% and about 80%, about 50% and about 70%, abot 50% and about 60%, 60% and about 99%, about 60% and about 95%, about 60% and about 90%, about 60% and about 85%, about 60% and about 80%, about 60% and about 70%, about 70% and about 99%, about 70% and about 95%, about 70% and about 90%, about 70% and about 85%, about 70% and about 80%, about 80% and about 99%, about 80% and about 95%, about 80% and about 90%, about 80% and about 85%, about 85% and about 99%, about 85% and about 95%, about 80% and about 85%, about 85% and about 99%, about 85% and about 90%, about 90% and about 99%, about 90% and about 95%, or about 95% and about 99%. In some embodiments, the nanostructures display a photoluminescence quantum yield of between about 82% and about 96%, between about 85% and about 96%, and between about 93% and about 94%.

The photoluminescence spectrum of the nanostructures can cover essentially any desired portion of the spectrum. In some embodiments, the photoluminescence spectrum for the nanostructures have a emission maximum between 300 nm and 750 nm, 300 nm and 650 nm, 300 nm and 550 nm, 300 nm and 450 nm, 450 nm and 750 nm, 450 nm and 650 nm, 450 nm and 550 nm, 450 nm and 750 nm, 450 nm and 650 nm, 450 nm and 550 nm, 550 nm and 750 nm, 550 nm and 650 nm, or 650 nm and 750 nm. In some embodiments, the photoluminescence spectrum for the nanostructures has an emission maximum of between 450 nm and 550 nm.

The size distribution of the nanostructures can be relatively narrow. In some embodiments, the photoluminescence spectrum of the population of nanostructures can have a full width at half maximum of between 10 nm and 60 nm, 10 nm and 40 nm, 10 nm and 30 nm, 10 nm and 20 nm, 20 nm and 60 nm, 20 nm and 40 nm, 20 nm and 30 nm, 30 nm and 60 nm, 30 nm and 40 nm, or 40 nm and 60 nm. In some embodiments, the photoluminescence spectrum of the population of nanostructures can have a full width at half maximum of between 35 nm and 50 nm.

In some embodiments, the nanostructures emit light having a peak emission wavelength (PWL) between about 400 nm and about 650 nm, about 400 nm and about 600 nm, about 400 nm and about 550 nm, about 400 nm and about 500 nm, about 400 nm and about 450 nm, about 450 nm and about 650 nm, about 450 nm and about 600 nm, about 450 nm and about 550 nm, about 450 nm and about 500 nm, about 500 nm and about 650 nm, about 500 nm and about 600 nm, about 500 nm and about 550 nm, about 550 nm and about 650 nm, about 550 nm and about 600 nm, or about 600 nm and about 650 nm. In some embodiments, the nanostructures emit light having a PWL between about 500 nm and about 550 nm.

As a predictive value for blue light absorption efficiency, the optical density at 450 nm on a per mass basis ($OD_{450}$/mass) can be calculated by measuring the optical density of a nanostructure solution in a 1 cm path length cuvette and dividing by the dry mass per mL of the same solution after removing all volatiles under vacuum (<200 mTorr) In some embodiments, the nanostructures have an optical density at 450 nm on a per mass basis ($OD_{450}$/mass) of between about 0.28/mg and about 0.5/mg, about 0.28/mg and about 0.4/mg, about 0.28/mg and about 0.35/mg, about 0.28/mg and about 0.32/mg, about 0.32/mg and about 0.5/mg, about 0.32/mg and about 0.4/mg, about 0.32/mg and about 0.35/mg, about 0.35/mg and about 0.5/mg, about 0.35/mg and about 0.4/mg, or about 0.4/mg and about 0.5/mg.

Films

The nanostructures of the present invention can be embedded in a polymeric matrix using any suitable method. As used herein, the term "embedded" is used to indicate that the nanostructures are enclosed or encased with the polymer that makes up the majority of the component of the matrix. In some embodiments, the at least one nanostructure population is suitably uniformly distributed throughout the matrix. In some embodiments, the at least one nanostructure population is distributed according to an application-specific distribution. In some embodiments, the nanostructures are mixed in a polymer and applied to the surface of a substrate.

In some embodiments, the present disclosure provides a nanostructure film layer comprising:
 (a) at least one population of nanostructures, the nanostructures comprising AIGS/AGS core-shell nanostructures, wherein the nanostructures have a PWL between 480 and 545, wherein at least about 80% of the emission is band-edge emission, and wherein the nanostructures exhibit a QY of 80-99.9%; and
 (b) at least one organic resin.

The present disclosure also provides a method of preparing a nanostructure film layer comprising:
 (a) providing at least one population of AIGS/AGS core-shell nanostructures, wherein the nanostructures have a PWL of between 480-545 nm, wherein at least about 80% of the emission is band-edge emission, and wherein the nanostructures exhibit a QY of 80-99.9%; and
 (b) admixing at least one organic resin with the composition of (a).

In some embodiments, at least 80% of the emission is band-edge emission. In other embodiments, at least 90% of the emission is band-edge emission. In other embodiments, at least 95% of the emission is band-edge emission. In some embodiments, 92-98% of the emission is band-edge emission. In some embodiments, 93-96% of the emission is band-edge emission. In another embodiment, the nanostructures are quantum dots.

In some embodiments, the nanostructure film layer is a color conversion layer.

The nanostructure composition can be deposited by any suitable method known in the art, including but not limited to painting, spray coating, solvent spraying, wet coating, adhesive coating, spin coating, tape-coating, roll coating, flow coating, inkjet vapor jetting, drop casting, blade coating, mist deposition, or a combination thereof. Preferably, the quantum dot composition is cured after deposition. Suitable curing methods include photo-curing, such as UV curing, and thermal curing. Traditional laminate film processing methods, tape-coating methods, and/or roll-to-roll fabrication methods can be employed in forming the quantum dot films of the present invention. The quantum dot composition can be coated directly onto the desired layer of a substrate. Alternatively, the quantum dot composition can be formed into a solid layer as an independent element and subsequently applied to the substrate. In some embodiments, the nanostructure composition can be deposited on one or more barrier layers.

Spin Coating

In some embodiments, the nanostructure composition is deposited onto a substrate using spin coating. In spin coating a small amount of material is typically deposited onto the center of a substrate loaded a machine called the spinner which is secured by a vacuum. A high speed of rotation is applied on the substrate through the spinner which causes centripetal force to spread the material from the center to the edge of the substrate. While most of the material would be spun off, a certain amount remains on the substrate, forming a thin film of material on the surface as the rotation continues. The final thickness of the film is determined by the nature of the deposited material and the substrate in addition to the parameters chosen for the spin process such as spin speed, acceleration, and spin time. For typical films, a spin speed of 1500 to 6000 rpm is used with a spin time of 10-60 seconds.

Mist Deposition

In some embodiments, the nanostructure composition is deposited onto a substrate using mist deposition. Mist deposition takes place at room temperature and atmospheric pressure and allows precise control over film thickness by changing the process conditions. During mist deposition, a liquid source material is turned into a very fine mist and carried to the deposition chamber by nitrogen gas. The mist is then drawn to the wafer surface by a high voltage potential between the field screen and the wafer holder. Once the droplets coalesce on the wafer surface, the wafer is removed from the chamber and thermally cured to allow the solvent to evaporate. The liquid precursor is a mixture of solvent and material to be deposited. It is carried to the atomizer by pressurized nitrogen gas. Price, S. C., et al., "Formation of Ultra-Thin Quantum Dot Films by Mist Deposition," ESC Transactions 11:89-94 (2007).

Spray Coating

In some embodiments, the nanostructure composition is deposited onto a substrate using spray coating. The typical equipment for spray coating comprises a spray nozzle, an atomizer, a precursor solution, and a carrier gas. In the spray deposition process, a precursor solution is pulverized into micro sized drops by means of a carrier gas or by atomization (e.g., ultrasonic, air blast, or electrostatic). The droplets that come out of the atomizer are accelerated by the substrate surface through the nozzle by help of the carrier gas which is controlled and regulated as desired. Relative motion between the spray nozzle and the substrate is defined by design for the purpose of full coverage on the substrate.

In some embodiments, application of the nanostructure composition further comprises a solvent. In some embodiments, the solvent for application of the quantum dot composition is water, organic solvents, inorganic solvents, halogenated organic solvents, or mixtures thereof. Illustrative solvents include, but are not limited to, water, $D_2O$, acetone, ethanol, dioxane, ethyl acetate, methyl ethyl ketone, isopropanol, anisole, γ-butyrolactone, dimethylformamide, N-methylpyrroldinone, dimethylacetamide, hexamethylphosphoramide, toluene, dimethylsulfoxide, cyclopentanone, tetramethylene sulfoxide, xylene, ε-caprolactone, tetrahydrofuran, tetrachloroethylene, chloroform, chlorobenzene, dichloromethane, 1,2-dichloroethane, 1,1,2,2-tetrachloroethane, or mixtures thereof.

In some embodiments, the compositions are thermally cured to form the nanostructure layer. In some embodiments, the compositions are cured using UV light. In some embodiments, the quantum dot composition is coated directly onto a barrier layer of a quantum dot film, and an additional barrier layer is subsequently deposited upon the quantum dot layer to create the quantum dot film. A support substrate can be employed beneath the barrier film for added strength, stability, and coating uniformity, and to prevent material inconsistency, air bubble formation, and wrinkling or folding of the barrier layer material or other materials. Additionally, one or more barrier layers are preferably deposited over a quantum dot layer to seal the material between the top and bottom barrier layers. Suitably, the barrier layers can be deposited as a laminate film and optionally sealed or further processed, followed by incorporation of the nanostructure film into the particular lighting device. The nanostructure composition deposition process can include additional or varied components, as will be understood by persons of ordinary skill in the art. Such embodiments will allow for in-line process adjustments of the nanostructure emission characteristics, such as brightness and color (e.g., to adjust the quantum film white point), as well as the nanostructure film thickness and other characteristics. Additionally, these embodiments will allow for periodic testing of the quantum dot film characteristics during production, as well as any necessary toggling to achieve precise nanostructure film characteristics. Such testing and adjustments can also be accomplished without changing the mechanical configuration of the processing line, as a computer program can be employed to electronically change the respective amounts of mixtures to be used in forming a nanostructure film.

Nanostructure Film Features and Embodiments

In some embodiments, the nanostructure films of the present invention are used to form display devices. As used herein, a display device refers to any system with a lighting display. Such devices include, but are not limited to, devices encompassing a liquid crystal display (LCD), televisions, computers, mobile phones, smart phones, personal digital assistants (PDAs), gaming devices, electronic reading devices, digital cameras, and the like.

In some embodiments, the nanostructure films are part of a quantum dot color conversion layer.

In some embodiments, the display device comprises a quantum dot color converter. In some embodiments, the display device comprises a back plane; a display panel disposed on the back plane; and a quantum dot layer comprising the nanostructure. In some embodiments, the quantum dot layer is disposed on the display panel. In some embodiments, the quantum dot layer comprises a patterned quantum dot layer.

In some embodiments, the backplane comprises a blue LED, an LCD, an OLED, or a microLED.

In some embodiments, the display device comprises a quantum dot color converter. In some embodiments, the display device comprises a quantum dot layer comprising the nanostructure, and a light source element selected from the group consisting of a blue LED, an OLED, a microLED, and a combination thereof. In some embodiments, the quantum dot layer is disposed on the light source element. In some embodiments, the quantum dot layer comprises a patterned quantum dot layer. The patterned quantum dot layer may be prepared by any known method in the art. In one embodiment, the patterned quantum dot layer is prepared by ink-jet printing of a solution of the quantum dots. Suitable solvents for the solution include, without limitation, dipropylene glycol monomethyl ether acetate (DPMA), polyglycidyl methacrylate (PGMA), diethylene glycol monoethyl ether acetate (EDGAC), and propylene glycol methyl ether acetate (PGMEA). Volatile solvents may also be used in inkjet printing because they allow for rapid drying. Volatile solvents include ethanol, methanol, 1-propanol, 2-propanol, acetone, methyl ethyl ketone, methyl isobutyl ketone, ethyl acetate, and tetrahydrofuran.

In some embodiments, the quantum dot layer has a thickness between about 1 μm and about 25 μm. In some embodiments, the quantum dot layer has a thickness between about 5 μm and about 25 μm. In some embodiments, the quantum dot layer has a thickness between about 10 μm and about 12 μm.

In some embodiments, the optical films containing nanostructure compositions are substantially free of cadmium. As used herein, the term "substantially free of cadmium" is intended that the nanostructure compositions contain less than 100 ppm by weight of cadmium. The RoHS compliance definition requires that there must be no more than 0.01% (100 ppm) by weight of cadmium in the raw homogeneous precursor materials. The cadmium concentration can be measured by inductively coupled plasma mass spectroscopy (ICP-MS) analysis, and are on the parts per billion (ppb) level. In some embodiments, optical films that are "substantially free of cadmium" contain 10 to 90 ppm cadmium. In other embodiment, optical films that are substantially free of cadmium contain less than about 50 ppm, less than about 20 ppm, less than about 10 ppm, or less than about 1 ppm of cadmium.

Nanostructure Molded Article

In some embodiments, the present disclosure provides a nanostructure molded article comprising:
  (a) a first barrier layer;
  (b) a second barrier layer; and
  (c) a nanostructure layer between the first barrier layer and the second barrier layer, wherein the nanostructure layer comprises a population of nanostructures comprising AIGS/AGS core-shell nanostructures, wherein the nanostructures have a PWL between 480-545, wherein at least about 80% of the emission is band-edge emission and exhibit a QY of 80-99.9%; and at least one organic resin.

In some embodiments, the present disclosure provides a nanostructure molded article comprising:
(a) a first barrier layer;
(b) a second barrier layer; and
(c) a nanostructure layer between the first barrier layer and the second barrier layer, wherein the nanostructure layer comprises a population of nanostructures comprising AIGS/AGS core-shell nanostructures, wherein the nanostructures have a PWL between 480-545, wherein at least about 80% of the emission is band-edge emission and wherein the nanostructures exhibit a QY of 80-99.9%; and at least one organic resin.

In some embodiments, at least 80% of the emission is band-edge emission. In other embodiments, at least 90% of the emission is band-edge emission. In other embodiments, at least 95% of the emission is band-edge emission. In some embodiments, 92-98% of the emission is band-edge emission. In some embodiments, 93-96% of the emission is band-edge emission. In another embodiment, the nanostructures are quantum dots.

Barrier Layers

In some embodiments, the nanostructure molded article comprises one or more barrier layers disposed on either one or both sides of the nanostructure layer. Suitable barrier layers protect the nanostructure layer and the nanostructure molded article from environmental conditions such as high temperatures, oxygen, and moisture. Suitable barrier materials include non-yellowing, transparent optical materials which are hydrophobic, chemically and mechanically compatible with the nanostructure molded article, exhibit photo- and chemical-stability, and can withstand high temperatures. Preferably, the one or more barrier layers are index-matched to the nanostructure molded article. In preferred embodiments, the matrix material of the nanostructure molded article and the one or more adjacent barrier layers are index-matched to have similar refractive indices, such that most of the light transmitting through the barrier layer toward the nanostructure molded article is transmitted from the barrier layer into the nanostructure layer. This index-matching reduces optical losses at the interface between the barrier and matrix materials.

The barrier layers are suitably solid materials, and can be a cured liquid, gel, or polymer. The barrier layers can comprise flexible or non-flexible materials, depending on the particular application. Barrier layers are preferably planar layers, and can include any suitable shape and surface area configuration, depending on the particular lighting application. In preferred embodiments, the one or more barrier layers will be compatible with laminate film processing techniques, whereby the nanostructure layer is disposed on at least a first barrier layer, and at least a second barrier layer is disposed on the nanostructure layer on a side opposite the nanostructure layer to form the nanostructure molded article according to one embodiment of the present invention. Suitable barrier materials include any suitable barrier materials known in the art. For example, suitable barrier materials include glasses, polymers, and oxides. Suitable barrier layer materials include, but are not limited to, polymers such as polyethylene terephthalate (PET); oxides such as silicon oxide, titanium oxide, or aluminum oxide (e.g., $SiO_2$, $Si_2O_3$, $TiO_2$, or $Al_2O_3$); and suitable combinations thereof. Preferably, each barrier layer of the nanostructure molded article comprises at least 2 layers comprising different materials or compositions, such that the multi-layered barrier eliminates or reduces pinhole defect alignment in the barrier layer, providing an effective barrier to oxygen and moisture penetration into the nanostructure layer. The nanostructure layer can include any suitable material or combination of materials and any suitable number of barrier layers on either or both sides of the nanostructure layer. The materials, thickness, and number of barrier layers will depend on the particular application, and will suitably be chosen to maximize barrier protection and brightness of the nanostructure layer while minimizing thickness of the nanostructure molded article. In preferred embodiments, each barrier layer comprises a laminate film, preferably a dual laminate film, wherein the thickness of each barrier layer is sufficiently thick to eliminate wrinkling in roll-to-roll or laminate manufacturing processes. The number or thickness of the barriers may further depend on legal toxicity guidelines in embodiments where the nanostructure s comprise heavy metals or other toxic materials, which guidelines may require more or thicker barrier layers. Additional considerations for the barriers include cost, availability, and mechanical strength.

In some embodiments, the nanostructure film comprises two or more barrier layers adjacent each side of the nanostructure layer, for example, two or three layers on each side or two barrier layers on each side of the nanostructure layer. In some embodiments, each barrier layer comprises a thin glass sheet, e.g., glass sheets having a thickness of about 100 µm, 100 µm or less, or 50 µm or less.

Each barrier layer of the nanostructure film of the present invention can have any suitable thickness, which will depend on the particular requirements and characteristics of the lighting device and application, as well as the individual film components such as the barrier layers and the nanostructure layer, as will be understood by persons of ordinary skill in the art. In some embodiments, each barrier layer can have a thickness of 50 µm or less, 40 µm or less, 30 µm or less, 25 µm or less, 20 µm or less, or 15 µm or less. In certain embodiments, the barrier layer comprises an oxide coating, which can comprise materials such as silicon oxide, titanium oxide, and aluminum oxide (e.g., $SiO_2$, $Si_2O_3$, $TiO_2$, or $Al_2O_3$). The oxide coating can have a thickness of about 10 µm or less, 5 µm or less, 1 µm or less, or 100 nm or less. In certain embodiments, the barrier comprises a thin oxide coating with a thickness of about 100 nm or less, 10 nm or less, 5 nm or less, or 3 nm or less. The top and/or bottom barrier can consist of the thin oxide coating, or may comprise the thin oxide coating and one or more additional material layers.

Display Device with Nanostructure Color Conversion Layer

In some embodiments, the present invention provides a display device comprising:
(a) a display panel to emit a first light;
(b) a backlight unit configured to provide the first light to the display panel; and
(c) a color filter comprising at least one pixel region comprising a color conversion layer.

In some embodiments, the color filter comprises at least 1, 2, 3, 4, 5, 6, 7, 8, 9, or 10 pixel regions. In some embodiments, when blue light is incident on the color filter, red light, white light, green light, and/or blue light may be respectively emitted through the pixel regions. In some embodiments, the color filter is described in U.S. Pat. No. 9,971,076, which is incorporated herein by reference in its entirety.

In some embodiments, each pixel region includes a color conversion layer. In some embodiments, a color conversion layer comprises nanostructures described herein configured to convert incident light into light of a first color. In some embodiments, the color conversion layer comprises nanostructures described herein configured to convert incident light into blue light.

In some embodiments, the display device comprises 1, 2, 3, 4, 5, 6, 7, 8, 9, or 10 color conversion layers. In some embodiments, the display device comprises 1 color conversion layer comprising the nanostructures described herein. In some embodiments, the display device comprises 2 color conversion layers comprising the nanostructures described herein. In some embodiments, the display device comprises 3 color conversion layers comprising the nanostructures described herein. In some embodiments, the display device comprises 4 color conversion layers comprising the nanostructures described herein. In some embodiments, the display device comprises at least one red color conversion layer, at least one green color conversion layer, and at least one blue color conversion layer.

In some embodiments, the color conversion layer has a thickness between about 3 µm and about 10 µm, about 3 µm and about 8 µm, about 3 µm and about 6 µm, about 6 µm and about 10 µm, about 6 µm and about 8 µm, or about 8 µm and about 10 µm. In some embodiments, the color conversion layer has a thickness between about 3 µm and about 10 µm.

The nanostructure color conversion layer can be deposited by any suitable method known in the art, including but not limited to painting, spray coating, solvent spraying, wet coating, adhesive coating, spin coating, tape-coating, roll coating, flow coating, inkjet printing, photoresist patterning, drop casting, blade coating, mist deposition, or a combination thereof. In some embodiments, the nanostructure color conversion layer is deposited by photoresist patterning. In some embodiments, nanostructure color conversion layer is deposited by inkjet printing.

AIGS/AGS Core Shell Nanostructures with Silane Ligands

In some embodiments, the AIGS/AGS core-shell nanostructures further comprise a silane ligand. In some embodiments, the silane ligand is an aminoalkyltrialkoxysilane or mercaptoalkyltrialkoxysilane. Non-limiting examples of aminoalkyltrialkoxysilanes include 3-aminopropyl(trimethoxysilane), 3-aminopropyl(triethoxysilane), 3-aminopropyl(diethoxymethoxysilane), 3-aminopropyl(tripropoxysilane), 3-aminopropyl(dipropoxymethoxy silane), 3-aminopropyl(tridodecanoxysilane), 3-aminopropyl(tritetradecanoxysilane), 3-aminopropyl(trihexadecanoxysilane), 3-aminopropyl(trioctadecanoxysilane), 3-aminopropyl(didodecanoxy)tetradecanoxysilane, 3-aminopropyl(dodecanoxy)tetradecanoxy(hexadecanoxy)-silane, 3-aminopropyl(dimethoxymethylsilane), 3-aminopropyl(methoxydimethylsilane), 3-aminopropyl(hydroxydimethylsilane), 3-aminopropyl(diethoxymethylsilane), 3-aminopropyl(ethoxydimethylsilane), 3-aminopropyl(dipropoxymethylsilane), 3-aminopropyl(propoxydimethylsilane), 3-aminopropyl(diisopropoxymethylsilane), 3-aminopropyl(isopropoxydimethylsilane), 3-aminopropyl(dibutoxymethylsilane), 3-aminopropyl(butoxydimethylsilane), 3-aminopropyl(disiobutoxymethylsilane), 3-aminopropyl(isobutoxydimethylsilane), 3-aminopropyl(didodecanoxymethylsilane), 3-aminopropyl(dodecanoxydimethylsilane), 3-aminopropyl(ditetradecanoxymethylsilane), 3-aminopropyl(tetradecanoxydimethylsilane), 2-aminoethyl(trimethoxysilane), 2-aminoethyl(triethoxysilane), 2-aminoethyl(diethoxymethoxysilane), 2-aminoethyl(tripropoxysilane), 2-aminoethyl(dipropoxymethoxysilane), 2-aminoethyl(tridodecanoxysilane), 2-aminoethyl(tritetradecanoxysilane), 2-aminoethyl(trihexadecanoxysilane), 2-aminoethyl(trioctadecanoxysilane), 2-aminoethyl(didodecanoxy)tetradecanoxysilane, 2-aminoethyl(dodecanoxy)tetradecanoxy(hexadecanoxy) silane, 2-aminoethyl(dimethoxymethylsilane), 2-aminoethyl(methoxydimethylsilane), 2-aminoethyl(diethoxymethylsilane), 2-aminoethyl(ethoxydimethylsilane), 1-aminomethyl(trimethoxysilane), 1-aminomethyl(triethoxysilane), 1-aminomethyl(diethoxymethoxy silane), 1-aminomethyl(dipropoxymethoxysilane), 1-aminomethyl(tripropoxysilane), 1-aminomethyl(trimethoxysilane), 1-aminomethyl(dimethoxymethylsilane), 1-aminomethyl(methoxydimethylsilane), 1-aminomethyl(diethoxymethylsilane), 1-aminomethyl(ethoxydimethylsilane), 3-aminobutyl(trimethoxysilane), 3-aminobutyl(triethoxysilane), 3-aminobutyl(diethoxymethoxysilane), 3-aminobutyl(tripropoxysilane), 3-aminobutyl(dipropoxymethoxysilane), 3-aminobutyl(dimethoxymethylsilane), 3-aminobutyl(diethoxymethylsilane), 3-aminobutyl(dimethylmethoxysilane), 3-aminobutyl(dimethylethoxysilane), 3-aminobutyl(tridodecanoxysilane), 3-aminobutyl(tritetradecanoxysilane), 3-aminobutyl(trihexadecanoxysilane), 3-aminobutyl(didodecanoxy)tetradecanoxysilane, 3-aminobutyl(dodecanoxy)tetradecanoxy(hexadecanoxy) silane, 3-amino-2-methylpropyl(trimethoxysilane), 3-amino-2-methylpropyl(triethoxysilane), 3-amino-2-methylpropyl(diethoxymethoxysilane), 3-amino-2-methylpropyl(tripropoxysilane), 3-amino-2-methylpropyl(dipropoxymethoxysilane), 3-amino-2-methylpropyl(tridodecanoxysilane), 3-amino-2-methylpropyl(tritetradecanoxysilane), 3-amino-2-methylpropyl(trihexadecanoxysilane), 3-amino-2-methylpropyl(trioctadecanoxysilane), 3-amino-2-methylpropyl(didodecanoxy)tetradecanoxy-silane, 3-amino-2-methylpropyl(dodecanoxy)tetradecanoxy-(hexadecanoxy) silane, 3-amino-2-methylpropyl(dimethoxymethylsilane), 3-amino-2-methylpropyl(methoxydimethylsilane), 3-mercapto-2-methylpropyl(diethoxymethylsilane), 3-mercapto-2-methylpropyl(ethoxydimethylsilane), 3-mercapto-2-methylpropyl(dipropoxymethylsilane), 3-amino-2-methylpropyl(propoxydimethylsilane), 3-amino-2-methylpropyl(diisopropoxymethylsilane), 3-amino-2-methylpropyl(isopropoxydimethylsilane), 3-amino-2-methylpropyl(dibutoxymethylsilane), 3-amino-2-methylpropyl(butoxydimethylsilane), 3-amino-2-methylpropyl(disiobutoxymethylsilane), 3-amino-2-methylpropyl(isobutoxydimethylsilane), 3-amino-2-methylpropyl(didodecanoxymethylsilane), 3-amino-2-methylpropyl(dodecanoxydimethylsilane), 3-amino-2-methylpropyl(ditetradecanoxymethylsilane) and 3-amino-2-methylpropyl(tetradecanoxydimethylsilane).

Non-limiting examples of mercaptoalkyltrialkoxysilanes include 1-mercaptomethyltriethoxysilane, 1-mercaptoethyltrimethoxysilane, 1-mercaptoethyltriethoxysilane, 2-mercaptoethyltrimethoxysilane, 2-mercaptoethyltriethoxysilane, 3-mercapto-1-propyltrimethoxysilane, 3-mercapto-1-propyltriethoxysilane, 3-mercapto-1-propylmethyldimethoxysilane, 3-mercapto-1-propylmethyldiethoxysilane, 3-mercapto-1-propyldimethylethoxysilane, 3-mercapto-1-propyldimethylmethoxysilane, 3-mercapto-1-propyltripropoxysilane, 3-mercapto-1-propyltriisopropoxysilane, 3-mercapto-1-propyltributoxysilane, 8-mercapto-1-octyltrimethoxysilane, 8-mercapto-1-octyltriethoxysilane, 10-mercapto-1-decyltriethoxysilane, 10-mercapto-1-decyltrimethoxysilane, mercaptomethyltriethoxysilane, and mercaptomethyltrimethoxysilane.

The AIGS/AGS core-shell nanostructures with an aminoalkyltrialkoxysilane ligand adhere much more strongly to glass compared to when a polyethylene glycol-containing ligand is used. Thus, AIGS/AGS- silane ligands are uniquely suitable for use in quantum dot color conversion layers.

The following examples are illustrative and non-limiting, of the products and methods described herein. Suitable modifications and adaptations of the variety of conditions, formulations, and other parameters normally encountered in the field and which are obvious to those skilled in the art in view of this disclosure are within the spirit and scope of the invention.

EXAMPLES

Example 1: AIGS Core Synthesis

Figure 1B:
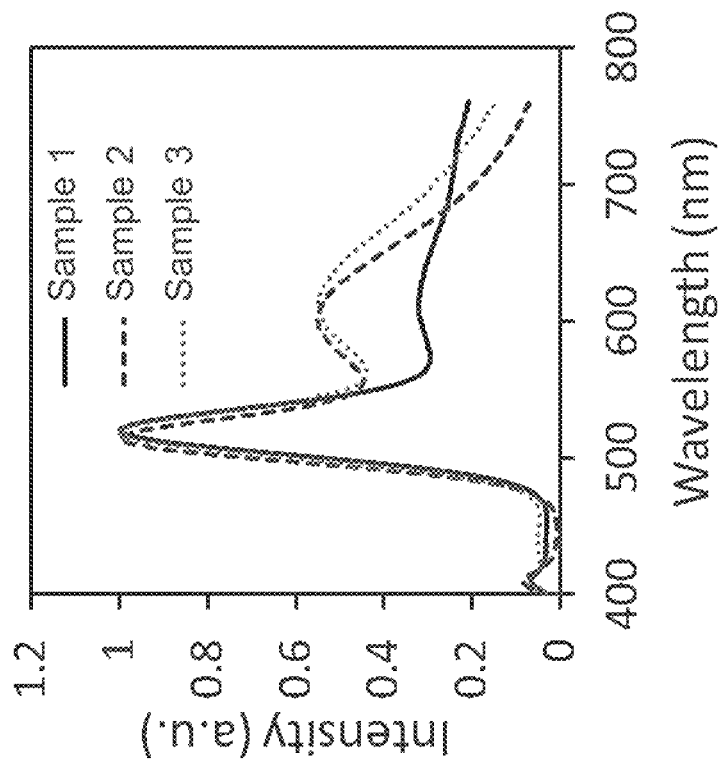
Figure 2:
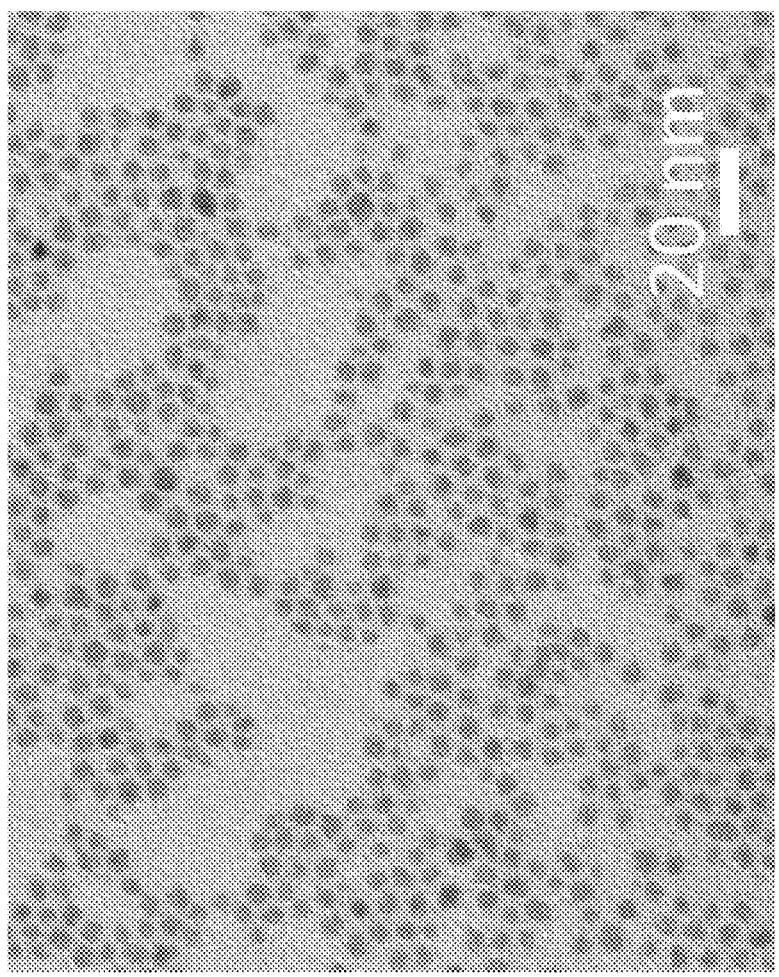
FIG. 2 is a transmission electron microscopy (TEM) image of AIGS cores.

Sample ID 1 was prepared using the following typical synthesis of AIGS cores: 4 mL of 0.06 M $CH_3CO_2Ag$ in oleylamine, 1 mL of 0.2 M $InCl3$ in ethanol, 1 mL of 0.95 M sulfur in oleylamine, and 0.5 mL dodecanethiol were injected into a flask that contained 5 mL of degassed octadecene, 300 mg of trioctylphosphine oxide, and 170 mg of gallium acetylacetonate. The mixture was heated to 40° C. for 5 minutes, then the temperature was raised to 210° C. and held for 100 minutes. After cooling to 180° C., 5 mL trioctylphosphine was added. The reaction mixture was transferred to a glovebox and diluted with 5 mL toluene. The final AIGS product was precipitated by adding 75 mL ethanol, centrifuged, and redispersed in toluene. Sample IDs 2 and 3 were also prepared using this method. The optical properties of AIGS cores were measured as shown in FIGS. 1A and 1B and summarized in Table 1. AIGS core sizes and morphology were characterized by transmission electron microscopy (TEM) as shown in FIG. 2.

TABLE 1

| Sample ID | QY (%) | PWL (nm) | FWHM (nm) | Ag/(Ag + In + Ga) by ICP | In/(In + Ga) by ICP | Note |
|---|---|---|---|---|---|---|
| 1 | 44 | 519.5 | 47 | 0.39 | 0.44 | 50 mL flask scale |
| 2 | 30 | 514 | 50 | 0.37 | 0.41 | 10x scale up of Sample ID 1 |
| 3 | 40 | 518 | 52 | 0.38 | 0.45 | 10x scale up of Sample ID 1 |

Example 2: AIGS/AGS Core/Shell Synthesis

Figure 3:
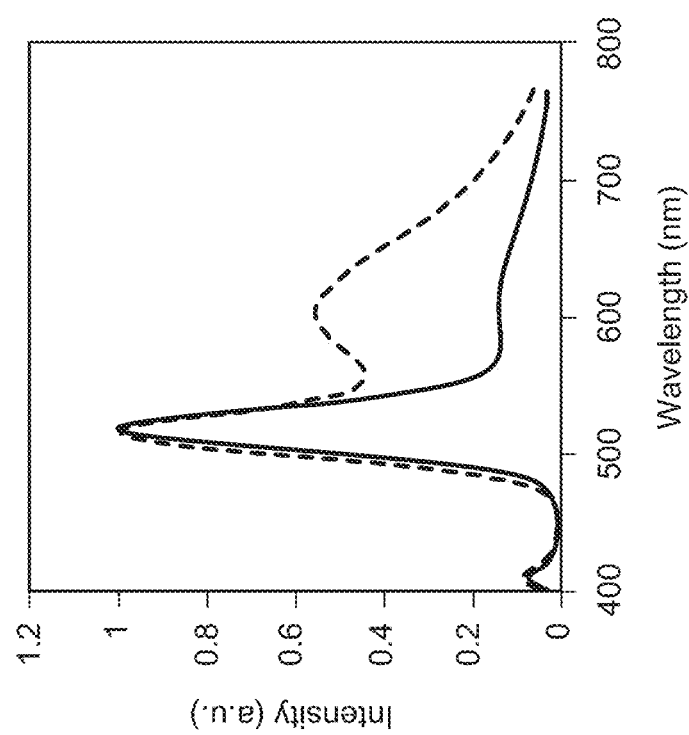
FIG. 3 is a graph showing the photoluminescence spectra of starting AIGS cores (-) and AIGS core/AGS (Ag—Ga—S) shell (AIGS/AGS) (-) nanostructures.
Figure 4:
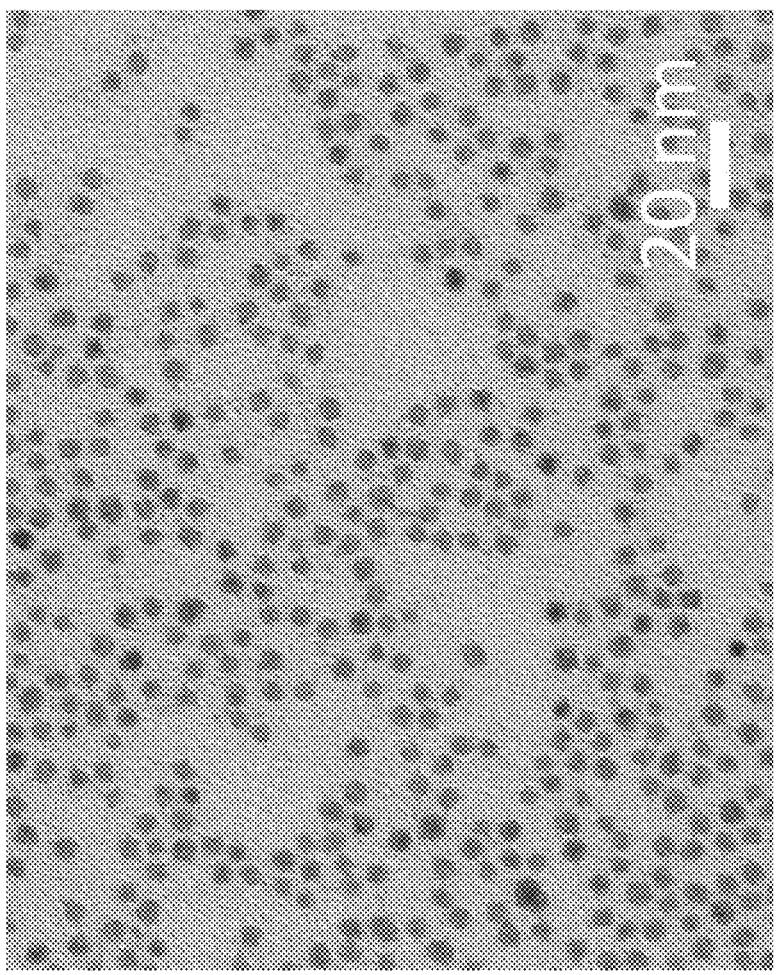
FIG. 4 is a transmission electron microscopy (TEM) image of AIGS/AGS core/shell nanostructures.

Sample ID 4 was prepared using the following typical synthesis of a AIGS/AGS core/shell: 2 mL of a 0.3 M gallium oleate solution in octadecene and 12 mL oleylamine were introduced to a flask and degassed. The mixture was heated to 270° C. A pre-mixed solution of 1 mL of a 0.95 M sulfur solution in oleylamine and 1 mL of isolated AIGS cores (15 mg/mL) were co-injected. The shell growth was stopped after 30 minutes. The final core/shell product was transferred to a glovebox, washed with toluene/ethanol, centrifuged, and redispersed in toluene. Sample IDs 4-8 were also prepared using this method. The optical properties of AIGS/AGS core/shell materials are shown in FIG. 3 and summarized in Table 2. Growth of the shell resulted in nearly complete band-edge emission. An increase of the average particle size following shell growth was observed by TEM as shown in FIG. 4.

TABLE 2

| Sample ID | PWL (nm) | FWHM (nm) | QY (%) | $OD_{450}$/mass $(mL \cdot mg^{-1} \cdot cm^{-1})$ |
|---|---|---|---|---|
| 4 | 516 | 38 | 61 | — |
| 5 | 517 | 36 | 58 | 0.87 |
| 6 | 520 | 37 | 53 | 1.04 |
| 7 | 514 | 38 | 64 | 0.72 |
| 8 | 514 | 38 | 65 | 1.15 |

Example 3: Gallium Halide and Trioctylphosphine Surface Treatment

Figures 5A, 5B:
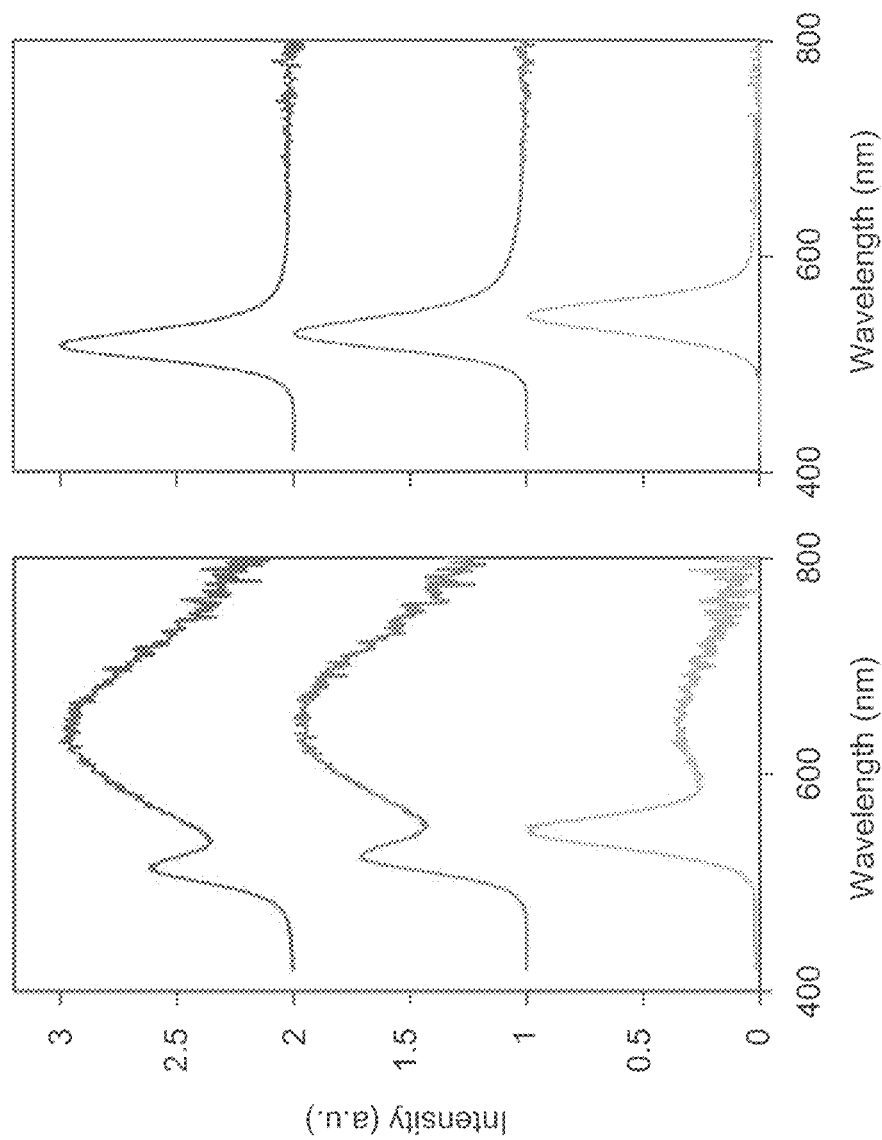
FIGS. 5A and 5B are photoluminescence spectra of AIGS cores before (FIG. 5A) and after (FIG. 5B) surface treatment with GaI$_3$/trioctylphosphine (TOP). Band-edge emission for AIGS nanostructures before surface treatment varied from 513-548 nm with total quantum yield (QY) (band-edge+ defect emission) ranging from 5-15%. After surface treatment with GaI$_3$/TOP, the band-edge emission contribution was significantly enhanced while emission wavelengths were maintained and the FWHM was improved (37-38 nm).

A roomtemperature surface modification of AIGS was conducted by the addition of a $GaI_3$ solution in trioctylphosphine (0.01-0.25 M) to AIGS QDs and holding at room temperature for 20 hours. This treatment led to a significant enhancement of the band-edge emission as shown in FIGS. 5A and 5B and summarized in Table 3, while maintaining substantially the peak wavelength (PWL). Thus, the present invention solves the problem of redshifting of the band-edge emission as observed with prior art methods (Uematsu et al., NPG Asia Materials 10:713-726 (2018); Kameyama et al., ACS Appl. Mater. Interfaces 10:42844-42855 (2018)).

Compositional changes before and after $GaI_3$ addition were monitored by inductively coupled plasma atomic emission spectroscopy (ICP-AES) and energy-dispersive X-ray spectroscopy (EDS) as summarized in Table 3. Composite images of In and Ga elemental distributions before and after $GaI_3$/TOP surface treatment showed a radial distribution of In to Ga.

TABLE 3

| ID | PWL (nm) | FWHM (nm) | QY (%) | Band-edge contribution | Ag/(Ag + In + Ga) by ICP | In/(In + Ga) by ICP | Ag/(Ag + In + Ga) by EDS | In/(In + Ga) by EDS |
|---|---|---|---|---|---|---|---|---|
| 9 | 542 | 38 | 11 | <45% | 0.41 | 0.11 | 0.45 | 0.16 |
| 10 | 543 | 37 | 24 | >80% | 0.38 | 0.09 | 0.44 | 0.14 |

Example 4: AIGS/AGS Core/Shell Synthesis using Oxygen-Free Ga Sources

Sample ID 14 and 15 was prepared using the following typical synthesis of a AIGS/AGS core/shell using an oxygen-free Ga source: to 8 mL degassed oleylamine, 400 mg of GaCl$_3$ dissolved in 400 µL toluene was added, followed by 40 mg of AIGS core and then 1.7 mL of 0.95 M sulfur in oleylamine. After heating to 240° C., the reaction was held for 2 hours and then cooled. The final core/shell product was transferred to a glovebox, washed with toluene/ethanol, centrifuged, and dispersed in toluene. Sample IDs 15 and 16 were also prepared using this method. Sample IDs 11-13 were prepared using the method of Example 2. The optical properties of AIGS/AGS core/shell materials are shown in Table 4.

TABLE 4

| Sample ID | PWL (nm) | FWHM (nm) | QY (%) | BE % | gallium source |
|---|---|---|---|---|---|
| 11 | 525 | 43 | 25 | not determined | Ga(III) acetylacetonate) |
| 12 | 516 | 34 | 73 | 90 | gallium oleate |
| 13 | 522 | 35 | 72 | 87 | gallium oleate |
| 14 | 521 | 35 | 85 | 86 | Ga(III) chloride |
| 15 | 521 | 35 | 80 | 89 | Ga(III) chloride |
| 16 | not determined | not determined | not determined | not determined | Ga(III) iodide |

Figure 6B:
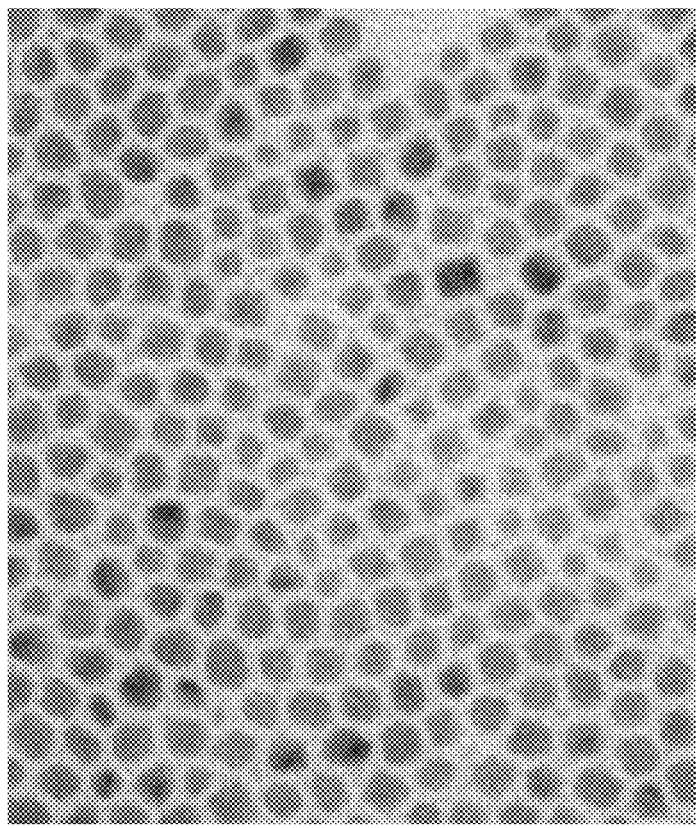
FIGS. 6A and 6B are TEM images of AIGS/AGS core/shell nanostructures prepared by shelling in oleylamine with an oxygen-containing Ga(III) oleate source (FIG. 6A) and with an oxygen-free Ga(III) chloride source (FIG. 6B). The TEM images show that the final shells are similar in size and have similar band edge to trap emission properties.
Figure 6A:
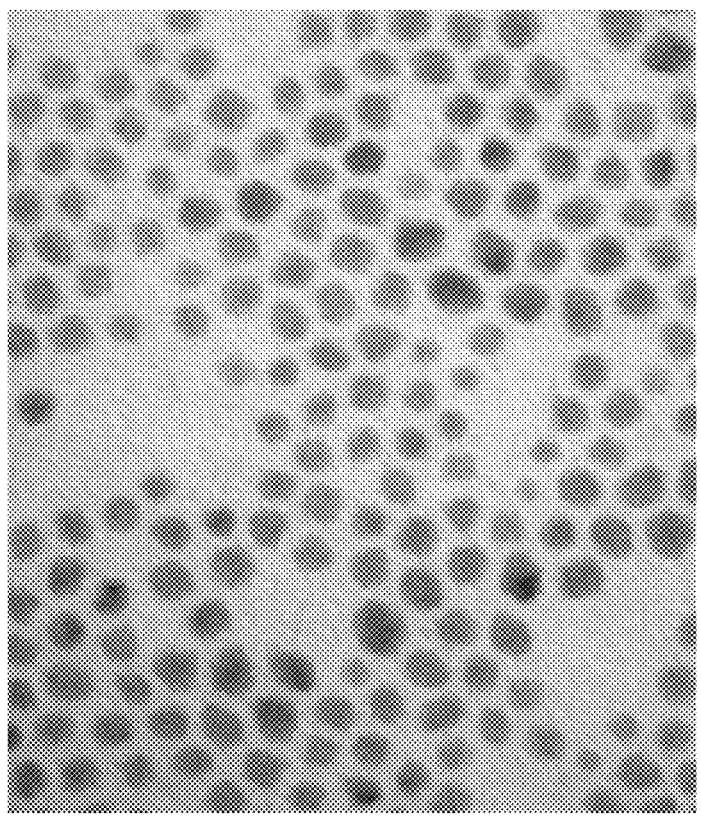
Figure 7:
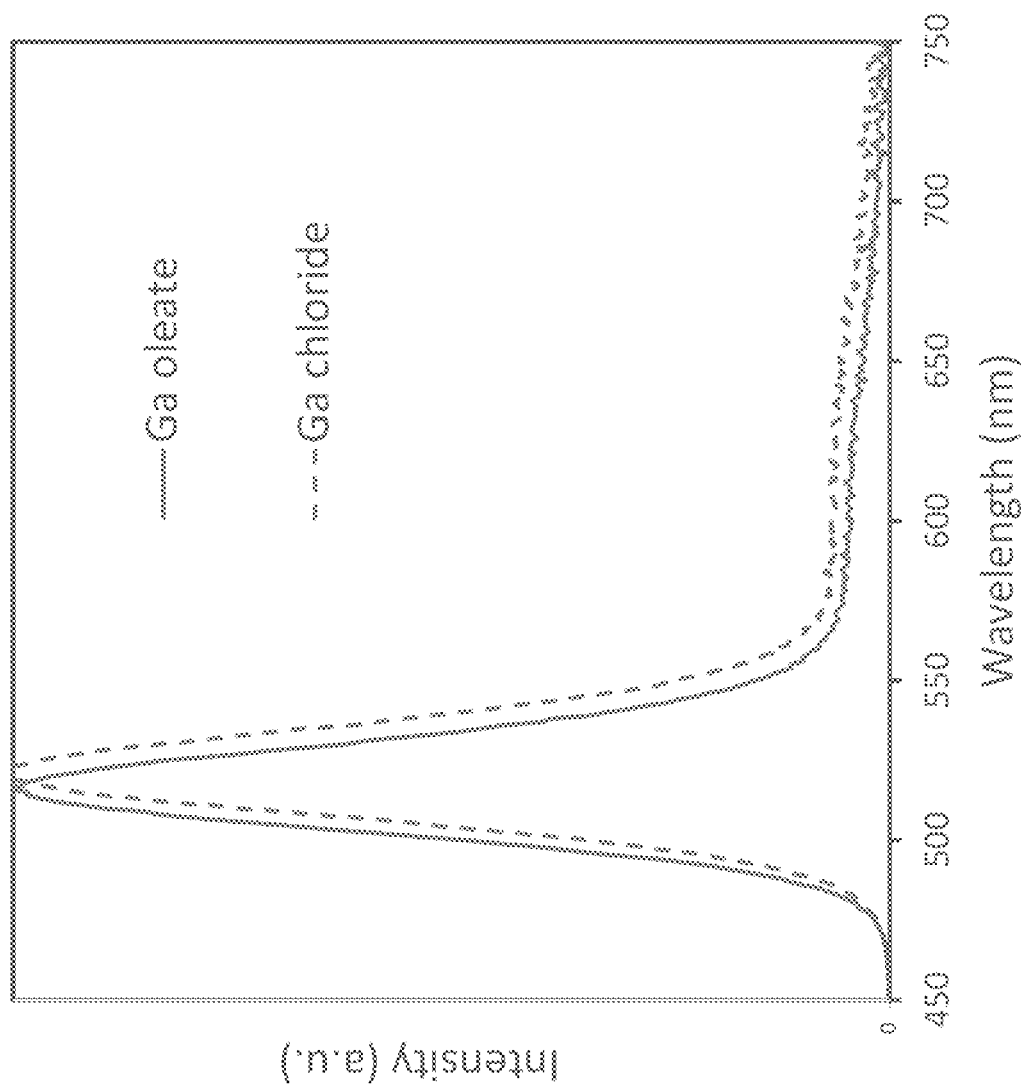
FIG. 7 is a line graph of AIGS/AGS core/shell nanostructures prepared by shelling in oleylamine with an oxygen-containing Ga(III) oleate source and an oxygen-free Ga(III) chloride source. The two nanostructures show a similar emission spectra.

As shown in Table 4, the quantum yield of AIGS/GS core/shell materials can be improved by using Ga(III) chloride rather than Ga(III) acetylacetonate or gallium oleate when oleylamine is used as a solvent. FIGS. 6A and 6B compare the size of the final core/shell materials and indicate that core/shell materials prepared using Ga(III) chloride have similar size and similar band-edge to trap emission properties. Therefore, the increase in quantum yield (QY) is not simply due to increasing the trap emission component. And, unexpectedly, it was found that when using Ga(III) iodide in place of Ga(III) chloride, the AIGS core appeared to dissolve in the reaction mixture and shelling did not occur.

High-resolution TEM with energy-dispersive X-ray spectroscopy (EDS) of Sample 14 showed that the shell is better described as a gradient from AIGS core to AGS shell which indicates that shelling under these conditions results from a process in which Ag becomes incorporated into the shell rather than growing a distinct thick layer of GS. This may also contribute to the improved quantum yield of the nanostructure due to less strain from the shell.

Example 5: AIGS Core from Hot Injection of Pre-Formed Ag$_2$S Nanostructures Mixed with Pre-Formed In—Ga Reagent To make the Ag$_2$S nanostructures, under a N$_2$ atmosphere, 0.5 g of AgI and 2 mL of oleylamine are added to 20 mL vial and stirred at 58° C. until clear a solution is obtained. In a separate 20 mL vial, 5 mL DDT and 9 mL of 0.95 M sulfur in oleylamine were mixed. The DDT+S-OYA mixture is added to AgI solution and stirred for 10 min at 58° C. The obtained Ag$_2$S nanoparticle were used without wash.

To make the In—Ga reagent mixture, 1.2 g Ga(acetylacetonate)$_3$, 0.35 g InCl$_3$, 2.5 mL oleylamine and 2.5 mL ODE charged to 100 mL flask. Under N$_2$ atm heated to 210° C. and held for 10 min. Orange color and viscous product obtained.

To form AIGS nanoparticles, under N$_2$, 1.75 g of TOPO, 23 mL of oleylamine and 25 mL ODE added to 250 mL flask. After degassing under vacuum, this solvent mixture is heated to 210° C. over 40 min. In a 40 mL vial, the Ag$_2$S and the In—Ga reagent mixture from above are mixed at 58° C. and transferred to syringe. The Ag—In—Ga mixture is then injected to the solvent mixture at 210° C. and held 3 hr. After cooling to 180° C., 5 mL trioctylphosphine was added. The reaction mixture was transferred to glovebox and diluted with 50 mL toluene. The final product was precipitated by adding 150 mL ethanol, centrifuged, and redispersed in toluene. Such core were shelled by the method described in Example 4. The optical properties of core/shell material made by this method at scales up to 24× that described above, are shown in Table 5.

TABLE 5

| Sample ID | PWL (nm) | FWHM (nm) | BE % | QY (%) | OD$_{450}$/mass (mL · mg$^{-1}$ · cm$^{-1}$) |
|---|---|---|---|---|---|
| 17 | 510 | 34 | 96 | 86 | — |
| 18 | 524 | 38 | 93 | 94 | 1.1 |
| 19 | 520 | 38 | 93 | 88 | 1.3 |
| 20 | 517 | 38 | 94 | 86 | 1.3 |
| 21 | 518 | 38 | 94 | 89 | 1.4 |
| 22 | 528 | 37 | 93 | 93 | 1.9 |

As shown in Table 5 the band edge emission percent and quantum yield are both unexpectedly improved using the method of preforming some reaction components of AIGS followed by injection into a hot solvent mixture.

Example 6—AIGS/AGS Nanostructures with a Silane Ligand

AIGS/GS core-shell nanostructures were reacted with a mixture of Jeffamine and (3-aminopropyl)trimethoxysilane (APTMS) to give a silane ligand complex. As shown in Table 6, the ligand-containing AIGS/AGS nanostructures maintained their QY of about 76%

TABLE 6

| QD type | QY |
|---|---|
| AIGS/AGS | 76.9% |
| AIGS/AGS with Jeffamine/APTMS | 76.3% |

While various embodiments have been described above, it should be understood that they have been presented by way of example only, and not limitation. It will be apparent to persons skilled in the relevant art that various changes in form and detail can be made therein without departing from the spirit and scope of the invention. Thus, the breadth and scope should not be limited by any of the above-described exemplary embodiments, but should be defined only in accordance with the following claims and their equivalents.

All publications, patents and patent applications mentioned in this specification are indicative of the level of skill of those skilled in the art to which this invention pertains, and are herein incorporated by reference to the same extent as if each individual publication, patent or patent application was specifically and individually indicated to be incorporated by reference.

What is claimed is:

1. Nanostructures comprising Ag, In, Ga, and S (AIGS) and a shell comprising Ag, Ga and S (AGS), wherein the nanostructures have a peak emission wavelength (PWL) in the range of 480-545 nm and wherein at least about 80% of the emission is band-edge emission, and wherein the nanostructures exhibit a quantum yield (QY) of 80-99.9%.

2. The nanostructures of claim 1, wherein the nanostructures have an emission spectrum with a FWHM of less than 40 nm.

3. The nanostructures of claim 2, wherein the nanostructures have an emission spectrum with a FWHM of 36-38 nm.

4. The nanostructures of claim 1, wherein the nanostructures have a QY of 82-96%.

5. The nanostructures of claim 4, wherein the nanostructures have a QY of 85-95%.

6. The nanostructures of claim 4, wherein the nanostructures have a QY of 86-94%.

7. The nanostructures of claim 1, wherein the nanostructures have an $OD_{450}$/mass ($mL \cdot mg^{-1} \cdot cm^{-1}$) greater than or equal to 0.8.

8. The nanostructures of claim 7, wherein the nanostructures have an $OD_{450}$/mass ($mL \cdot mg^{-1} \cdot cm^{-1}$) in the inclusive range 0.8-2.5.

9. The nanostructures of claim 8, wherein the nanostructures have an $OD_{450}$/mass ($mL \cdot mg^{-1} \cdot cm^{-1}$) in the inclusive range 0.87-1.9.

10. The nanostructures of claim 1, wherein the average diameter of the nanostructures is less than 10 nm by TEM.

11. The nanostructures of claim 10, wherein the average diameter is about 5 nm.

12. The nanostructures of claim 1, wherein at least about 80% of the emission is band-edge emission.

13. The nanostructures of claim 1, wherein at least about 90% of the emission is band-edge emission.

14. The nanostructures of claim 13, wherein 92-98% of the emission is band-edge emission.

15. The nanostructures of claim 13, wherein 93-96% of the emission is band-edge emission.

16. The nanostructures of claim 1, that are quantum dots.

17. A nanostructure composition comprising:
(a) at least one population of nanostructures of claim 1, and
(b) at least one organic resin.

18. The nanostructure composition of claim 17, further comprising at least one second population of nanostructures that have a PWL greater than 545 nm.

19. A method of preparing a nanostructure composition, the method comprising:
(a) providing at least one population of nanostructures of claim 1; and
(b) admixing at least one organic resin with the at least one population of (a).

20. The method of claim 19, wherein 92-98% of the emission is band-edge emission.

21. The method of claim 19, wherein 93-96% of the emission is band-edge emission.

22. A device comprising the composition of claim 17.

23. A film comprising the composition of claim 17, wherein the nanostructures are embedded in a matrix that comprises the film.

24. A nanostructure molded article comprising:
(a) a first conductive layer;
(b) a second conductive layer; and
(c) a nanostructure layer between the first conductive layer and the second conductive layer, wherein the nanostructure layer comprises the composition of claim 17.

25. A method of making the nanostructures of claim 1, comprising
(a) reacting Ga(acetylacetonate)$_3$, InCl$_3$, and a ligand optionally in a solvent at a temperature sufficient to give an In-Ga reagent, and
(b) reacting the In-Ga reagent with Ag$_2$S nanostructures at a temperature sufficient to make AIGS nanostructures,
(c) reacting the AIGS nanostructures with an oxygen-free Ga salt in a solvent containing a ligand at a temperature sufficient to form the nanostructures with a gradient comprising the AIGS core to AGS without a distinct layer of GS.

26. The method of claim 25, wherein the ligand is an alkylamine.

27. The method of claim 26, wherein the alkylamine is oleylamine.

28. The method of claim 25, wherein in (a) the solvent is present and is octadecene, squalane, dibenzylether or xylene.

29. The method of claim 25, wherein the temperature sufficient in (a) is 100 to 280° C.; the temperature sufficient in (b) is 150 to 260° C.; and the temperature sufficient in (c) is 170 to 280° C.

30. The method of claim 25, wherein the temperature sufficient in (a) is about 210° C., the temperature sufficient in (b) is about 210° C., and the temperature sufficient in (c) is about 240° C.

* * * * *